United States Patent
Kosier et al.

(10) Patent No.: US 10,746,817 B2
(45) Date of Patent: Aug. 18, 2020

(54) STRUCTURE AND SYSTEM FOR SIMULTANEOUS SENSING A MAGNETIC FIELD AND MECHANICAL STRESS

(71) Applicant: Allegro MicroSystems, LLC, Manchester, NH (US)

(72) Inventors: Steven Kosier, Lakeville, MN (US); Gregory Delmain, Minnetrista, MN (US)

(73) Assignee: Allegro MicroSystems, LLC, Manchester, NH (US)

( * ) Notice: Subject to any disclaimer, the term of this patent is extended or adjusted under 35 U.S.C. 154(b) by 347 days.

(21) Appl. No.: 15/807,741

(22) Filed: Nov. 9, 2017

(65) Prior Publication Data

US 2018/0321329 A1    Nov. 8, 2018

Related U.S. Application Data

(62) Division of application No. 14/810,665, filed on Jul. 28, 2015, now Pat. No. 9,851,417.

(51) Int. Cl.
  *G01R 33/02* (2006.01)
  *G01R 33/00* (2006.01)
  *G01R 33/07* (2006.01)

(52) U.S. Cl.
  CPC ......... *G01R 33/0082* (2013.01); *G01R 33/07* (2013.01)

(58) Field of Classification Search
  CPC ........ G01R 33/02; G01R 33/07; G01R 33/09; G01R 33/0082; G01R 33/075; G01D 5/145
  USPC ... 324/66–67, 160–180, 71.1–157, 425–470, 324/200–263, 750.01–764.01, 207.2, 324/207.25; 73/207.2, 207.25, 200–263, 73/66–132
  See application file for complete search history.

(56) References Cited

U.S. PATENT DOCUMENTS

| | | | |
|---|---|---|---|
| 4,236,832 A | 12/1980 | Komatsu et al. | |
| 4,374,333 A | * 2/1983 | Avery | G01R 33/07 323/294 |
| 4,438,347 A | 3/1984 | Gehring | |
| 4,490,674 A | 12/1984 | Ito | |

(Continued)

FOREIGN PATENT DOCUMENTS

| | | |
|---|---|---|
| DE | 195 39 458 A1 | 4/1997 |
| EP | 0 289 414 A2 | 11/1988 |

(Continued)

OTHER PUBLICATIONS

U.S. Appl. No. 14/681,575, filed Apr. 8, 2015, Cesaretti et al.

(Continued)

*Primary Examiner* — Jermele M Hollington
*Assistant Examiner* — Taqi R Nasir
(74) *Attorney, Agent, or Firm* — Daly, Crowley, Mofford & Durkee, LLP

(57) ABSTRACT

A structure having collocated magnetic field sensing elements can be used to simultaneously determine magnetic field and mechanical stress. A primary magnetic field sensing element generates a primary signal responsive to a magnetic field and a secondary magnetic field sensing element generates a secondary signal responsive to mechanical stress. A system includes a stress compensation module to receive the primary and signals, and to compensate for mechanical stress in the primary signal.

22 Claims, 5 Drawing Sheets

(56) References Cited

U.S. PATENT DOCUMENTS

| | | | |
|---|---|---|---|
| 4,752,733 | A | 6/1988 | Petr et al. |
| 4,760,285 | A | 7/1988 | Nelson |
| 4,823,075 | A | 4/1989 | Alley |
| 4,833,406 | A | 5/1989 | Foster |
| 4,970,411 | A | 11/1990 | Halg et al. |
| 5,247,278 | A | 9/1993 | Pant et al. |
| 5,285,155 | A | 2/1994 | Ueda et al. |
| 5,329,416 | A | 7/1994 | Ushiyama et al. |
| 5,412,255 | A | 5/1995 | Wallrafen |
| 5,469,058 | A | 11/1995 | Dunnam |
| 5,521,501 | A | 5/1996 | Dettmann et al. |
| 5,621,319 | A | 4/1997 | Bilotti et al. |
| 5,640,090 | A | 6/1997 | Furuya et al. |
| 6,291,989 | B1 | 9/2001 | Schroeder |
| 6,436,748 | B1 | 8/2002 | Forbes et al. |
| 6,437,558 | B2 | 8/2002 | Li et al. |
| 6,853,178 | B2 | 2/2005 | Hayat-Dawoodi |
| 6,896,407 | B2 | 5/2005 | Nomiyama et al. |
| 7,038,448 | B2 | 5/2006 | Schott et al. |
| 7,259,545 | B2 | 8/2007 | Stauth et al. |
| 7,474,093 | B2 | 1/2009 | Ausserlechner |
| 7,518,354 | B2 | 4/2009 | Stauth et al. |
| 7,746,056 | B2 | 6/2010 | Stauth et al. |
| 7,923,996 | B2 | 4/2011 | Doogue et al. |
| 8,030,918 | B2 | 10/2011 | Pastre et al. |
| 8,749,005 | B1 | 6/2014 | Foletto et al. |
| 9,548,443 | B2 * | 1/2017 | Wang ............... H01L 43/065 |
| 9,638,764 | B2 * | 5/2017 | Cesaretti ............ G01R 33/0023 |
| 2005/0162160 | A1 * | 7/2005 | Ausserlechner ...... G01L 5/0047 324/251 |
| 2006/0202692 | A1 | 9/2006 | Tatschl et al. |
| 2006/0261801 | A1 | 11/2006 | Busch |
| 2008/0074108 | A1 * | 3/2008 | Ausserlechner ..... G01R 33/075 324/226 |
| 2009/0001964 | A1 | 1/2009 | Strzalkowski |
| 2009/0085706 | A1 | 4/2009 | Baarman et al. |
| 2009/0146647 | A1 | 6/2009 | Ausserlechner |
| 2009/0206827 | A1 | 8/2009 | Aimuta et al. |
| 2009/0256559 | A1 * | 10/2009 | Ausserlechner ...... G01L 5/0047 324/251 |
| 2010/0072988 | A1 | 3/2010 | Hammerschmidt et al. |
| 2010/0211347 | A1 | 8/2010 | Friedrich et al. |
| 2012/0007589 | A1 | 1/2012 | Okada |
| 2012/0016614 | A1 | 1/2012 | Hohe et al. |
| 2014/0103921 | A1 * | 4/2014 | Raman ............... G01R 33/0041 324/251 |
| 2014/0264667 | A1 * | 9/2014 | Wang .................. G01R 33/077 257/421 |
| 2015/0142342 | A1 | 5/2015 | Huber et al. |
| 2016/0245880 | A1 | 8/2016 | Ausserlechner |
| 2017/0030980 | A1 | 2/2017 | Kosier et al. |

FOREIGN PATENT DOCUMENTS

| | | |
|---|---|---|
| EP | 0 357 013 A2 | 3/1990 |
| EP | 0 504 583 | 9/1992 |
| EP | 1 637 898 A1 | 3/2006 |
| EP | 1 850 143 A1 | 10/2007 |
| GB | 2 276 727 A | 10/1994 |
| JP | 61-48777 | 3/1986 |
| JP | S 6148777 A | 3/1986 |
| JP | S 63-11675 Y2 | 4/1988 |
| JP | 03-248611 | 11/1991 |
| JP | 2000-055999 | 2/2000 |
| JP | 2002-213992 | 7/2002 |
| JP | 2004-234589 | 8/2004 |
| JP | 2006-126012 | 5/2006 |
| JP | 2006126012 A | 5/2006 |
| KR | 1020070060096 | 6/2007 |
| WO | WO 96/02849 A1 | 2/1996 |
| WO | WO 2004/072672 A1 | 8/2004 |
| WO | WO 2006/056289 A1 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2010/096367 A1 | 8/2010 |

OTHER PUBLICATIONS

Ausserlechner et al., "Compensation of the Piezo-Hall Effect in Integrated Hall Sensors on (100)-Si;" Proceedings of the 2007 IEEE Sensors Journal, vol. 7, No. 11; Nov. 2007; 8 Pages.

Ausserlechner et al., "Drift of Magnetic Sensitivity of Smart Hall Sensors Due to Moisture Absorbed by the IC-Package;" Proceedings of the 2004 IEEE Sensors; Oct. 2004; 4 Pages.

Bahreyni, et al.; "A Resonant Micromachined Magnetic Field Sensor;" IEEE Sensors Journal; vol. 7, No. 9, Sep. 2007; 9 Pages.

Baltes et al., "Integrated Semiconductor Magnetic Field Sensors;" Proceedings of the 1986 IEEE, vol. 74, Issue 3; Aug. 1986; 28 Pages.

Barrettino, et al.; "CMOS-Based Monolithic Controllers for Smart Sensors Comprising Micromembranes and Microcantilevers;" IEEE Transactions on Circuits and Systems—I Regular Papers vol. 54, No. 1; Jan. 2007; 12 Pages.

Baschirotto et al.; "Development and Analysis of PCB Vector 2-D Magnetic Field Sensor System for Electronic Compass;" IEEE Sensors Journal vol. 6, No. 2; Apr. 2006; 7 Pages.

Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 Pages.

Demierre, et al.; "Reference Magnetic Actuator for Self-Calibration of a Very Small Hall Sensor Array;" Sensors and Actuators A97-98; Apr. 2002; 8 Pages.

Fischer et al., "Analyzing Parameters Influencing Stress and Drift in Moulded Hall Sensors;" Proceedings of the 2006 IEE Electronics Systemintegration Technology Conference, Dresden, Germany; Sep. 2006; 8 Pages.

Frick, et al.; "CMOS Microsystem for AC Current Measurement with Galvanic Isolation;" IEEE Sensor Journal; vol. 3, No. 6; Dec. 2003; 9 Pages.

Halg; "Piezo-Hall Coefficients of n-Type Silicon;" Journal of Applied Physics; vol. 64, No. 1; Jul. 1, 1988; 7 Pages.

Hosticka; "CMOS Sensor Systems;" Sensors and Actuators A66; Apr. 1998; 7 Pages.

Kanda et al.; "The Piezo-Hall Effect in n-Silicon;" $22^{nd}$ International Conference on the Physics of Semiconductors; vol. 1, Jan. 1995; 4 Pages.

Kaufmann et al., "Novel Coupling Concept for Five-Contact Vertical Hall Devices;" Proceedings of the 2011 IEEE Transducers Conference; Jun. 2011; 4 Pages.

Krammerer et al.: "A Hall effect sensors network insensitive to mechanical stress;" Proceedings of IEEE Sensors; vol. 3, Oct. 2004; 4 Pages.

Magnani et al., "Mechanical Stress Measurement Electronics Based on Piezo-Resistive and Piezo-Hall Effects;" Proceedings of the 2002 $9^{th}$ International Conference on Electronics, Circuits and Ssytems; Jan. 2002; 4 Pages.

Manic et al.; "Short and Long-Term Stability Problems of Hall Plates in Plastic Packages;" IEEE $38^{th}$ Annual International Reliability Physics Symposium; Apr. 2000; 6 Pages.

Manic, "Drift in Silicon Integrated Sensors and Circuits Due to the Thermo-Mechanical Stresses;" Lausanne, Ecole Polytechnique Federale De Lausanne 2000; 176 Pages.

Motz et al., "An Integrated Magnetic Sensor with Two Continuous-Time Converters and Stress Compensation Capability;" Proceedings of the 2006 IEEE International Solid-State Circuits Conference; Feb. 2006; 7 Pages.

Motz, et al.; "A Chopped Hall Sensor with Small Jitter and Programmable "True Power-On" Function;" IEEE Journal of Solid-State Circuits; vol. 40, No. 7; Jul. 2005; 8 Pages.

Motz, et al.; "An Integrated Hall Sensor Platform Design for Position, Angle and Current Sensing;" IEEE Sensors 2006; Exco, Daegu, Korea / Oct. 22-25, 2006; 4 Pages.

Munter; "A Low-offset Spinning-current Hall Plate;" Sensors and Actuators, vol. A21-A23; Jan. 1990; 4 Pages.

(56) References Cited

OTHER PUBLICATIONS

Munter; "Electronic Circuitry for a Smart Spinning-current Hall Plate with Low Offset;" Sensors and Actuators A; Jun. 1991; 5 Pages.
Partin et al.; "Temperature Stable Hall Effect Sensors;" IEEE Sensors Journal, vol. 6, No. 1; Feb. 2006; 5 Pages.
Pastre, et al.; "A Hall Sensor Analog Front End for Current Measurement with Continuous Gain Calibration;" IEEE Sensors Journal; vol. 7, No. 5; May 2007; 8 Pages.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; 4 Pages.
Popovic; "Sensor Microsystems;" Proc. $20^{th}$ International Conference on Microelectronics (MWIL 95); vol. 2, NIS, Serbia, Sep. 12-14, 1995; 7 Pages.
R.S. Popovic, "Hall Effect Devices: Magnetic Sensors and Characterization of Semiconductors;" Excerpt from Book; $1^{st}$ Edition; CRC Press; Jan. 1991; 2 Pages.
Randhawa; "Monolithic Integrated Hall Devices in Silicon Circuits;" Microelectronics Journal; vol. 12, No. 6; Sep. 14-17, 1981; 6 Pages.
Ruther et al., "Integrated CMOS-Based Sensor Array for Mechanical Stress Mapping;" Proceedings of the $5^{th}$ IEEE Sensors Conference; Oct. 2006; 4 Pages.
Ruther et al.; "Theromagnetic Residual Offset in Integrated Hall Plates;" IEEE Sensors Journal; vol. 3, No. 6; Dec. 2003; 7 Pages.
Sato et al., "Influences of Molding Conditions on Die-pad Behavior in IC Encapsulation Process Analyzed by Hall Element Method;" Proceedings of the 2000 IEEE Transactions on Advanced Packaging, vol. 23, No. 3; Aug. 2000; 8 Pages.
Schneider et al.; "Temperature Calibration of CMOS Magnetic Vector Probe for Contactless Angle Measurement System;" International Electron Devices Meeting; Dec. 8-11, 1996; 4 Pages.
Schott et al., "Linearizing Integrated Hall Devices;" Proceedings of the 1997 IEEE International Conference on Solid-State Sensors and Actuators; Jun. 1997; 4 Pages.
Schott, et al.; "CMOS Single-Chip Electronic Compass with Microcontroller;" IEEE Journal of Solid-State Circuits; vol. 42, No. 12; Dec. 2007; 11 Pages.
Simon et al.; "Autocalibration of Silicon Hall Devices;" $8^{th}$ International Conference on Solid-State Sensors and Actuators; vol. 2; Jun. 25, 1995; 4 Pages.
Steiner et al., "Double-Hall Sensor with Self-Compensated Offset;" Proceedings of the IEEE Electron Devices Meeting; Dec. 10, 1997; 4 Pages.
Steiner et al.; "Double-Hall Sensor with Self-Compensated Offset;" International Electron Devices Meeting; Dec. 7, 1997; ISBN: 0-7803-4100-7; 4 Pages.
Steiner et al; Offset Reduction in Hall Devices by Continuous Spinning Current Method; Sensors and Actuators A66; 1998; 6 Pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 Pages.
Tian et al.; "Multiple Sensors on Pulsed Eddy-Current Detection for 3-D Subsurface Crack Assessment;" IEEE Sensors Journal, vol. 5, No. 1; Feb. 2005; 7 Pages.
Trontelj et al; "CMOS Integrated Magnetic Field Source Used as a Reference in Magnetic Field Sensors on Common Substrate;" WEP 1-6; IMTC; May 1994; 3 Pages.
Udo Ausserlechner, "Limits of Offset Cancellation by the Principle of Spinning Current Hall Probe;" Proceedings of the 2004 IEEE Sensors Conference; Oct. 2004; 4 Pages.
Udo Ausserlechner, "The piezo-Hall Effect in n-silicon for Arbitrary Crystal Orientation;" Proceedings of the 2004 IEEE Sensors Conference; Oct. 2004; 4 Pages.
W.J. Grubbs, "Hall Effect Devices;" Article from Bell System Technical Journal, vol. 38, Issue 3; May 1959; 24 Pages.
Zou et al.; "Three-Dimensional Die Surface Stress Measurements in Delaminated and Non-Delaminated Plastic Packages;" 48th Electronic Components and Technology Conference; May 25, 1998; 12 Pages.
Allowed Claims filed on Jun. 5, 2017 for JP Pat. Appl. No. 2015-013206; 2 pages.
Amendment in Response to Office Action dated Jun. 6, 2017 and filed on Aug. 9, 2017 for U.S. Appl. No. 14/810,665; 14 pages.
Chinese $2^{nd}$ Office Action (with English Translation) dated Apr. 15, 2013 corresponding to Chinese Application No. 200980106535.4; 9 Pages.
Chinese $3^{rd}$ Office Action (with English Translation) dated Nov. 7, 2013 corresponding to Chinese Application No. 200980106535.4; 9 Pages.
Chinese Notice to Grant Application (with English Translation) dated Mar. 7, 2014 corresponding to Chinese Application No. 200980106535.4; 8 Pages.
Chinese Office Action (with English Translation) dated Aug. 29, 2012 corresponding to Chinese Application No. 200980106535.4; 8 Pages.
English Translation of Report of Re-Examination before Appeal dated Nov. 28, 2016 for JP Appl. No. 2015-013206; 3 pages.
First Notice of Allowance dated Jun. 27, 2011 corresponding with U.S. Appl. No. 12/959,672; 8 Pages.
First Notice of Allowance dated Nov. 3, 2010 corresponding to U.S. Appl. No. 12/037,393; 7 Pages.
Government of India, Patent Office Examination Report dated Mar. 6, 2017; 8 pages.
International Search Report and Written Opinion of the ISA dated Aug. 3, 2016; for PCT Application No. PCT/US2015/055230; 12 pages.
Japanese $2^{nd}$ Office Action (with English Translation) dated Nov. 28, 2013 corresponding to Japanese Application No. 2010-547666; 2 Pages.
Japanese Notice of Reasons for Rejection dated Jan. 4, 2016; For Japanese Pat. App. No. 2015-013206; 7 pages.
Japanese Office Action (with English Translation) dated Apr. 4, 2013 corresponding to Japanese Application No. 2010-547666; 4 Pages.
Korean Notice of Allowance (with Endish Translation) dated Apr. 20, 2015 corresponding to Korean Application No. 10-2010-7019498; 3 Pages.
Korean Notice of Allowance dated Jul. 31, 2015; for Korean Pat. App. No. 10-2014-7033792; 5 pages.
Korean Office Action (with English Translation) dated Jan. 30, 2015 corresponding to Korean Application No. 10-2014-7033792; 9 Pages.
Korean Office Action (with English Translation) dated Sep. 30, 2014 corresponding to Korean Application No. 10-2010-7019498; 10 Pages.
Letter from Japanese Associate dated Sep. 27, 2016 indicating Notice of Appeal filed in Japan and Current Claims on File dated Aug. 29, 2016 for Japanese Patent Application No. 2016-013206; 3 Pages.
Letter from Shardul Amarchand Mangaldas dated Sep. 15, 2017 for Indian Pat. Appl. No. 2318/KOLNP/2010; 1 page.
Letter from Yuasa and Hara dated Dec. 14, 2016 regarding Appeal for JP Pat Appl. No. 2015-013206; 3 pages.
Letter from Yuasa and Hara dated Jan. 28, 2016; For Japanese Pat. App. No. JP 2015-013206; 3 pages.
Letter from Yuasa and Hara dated Mar. 25, 2016; For Japanese Pat. App. No. 2015-013206; 1 page.
Letter to Yuasa and Hara dated Feb. 17, 2017 for JP Pat. Appli. No. 2015-013206; 3 pages.
Office Action dated Feb. 2, 2011 corresponding with U.S. Appl. No. 12/959,672; 13 Pages.
Office Action dated Jun. 30, 2010 corresponding to U.S. Appl. No. 12/037,393; 21 Pages.
Office Action dated Nov. 3, 2016 regarding U.S. Appl. No. 14/529,606; 12 pages.
Preliminary Amendment filed on Oct. 5, 2010 corresponding with U.S. Appl. No. 12/706,318; 11 Pages.

(56) References Cited

OTHER PUBLICATIONS

Preliminary Amendment filed on Aug. 17, 2015 corresponding with U.S. Appl. No. 14/810,665; 3 Pages.
Request for Continued Examination dated Jan. 25, 2011 corresponding to U.S. Appl. No. 12/037,393; 3 Pages.
Request for Continued Examination dated Jul. 12, 2011 corresponding with U.S. Appl. No. 12/959,672; 3 Pages.
Response 2016 with English Claims dated Mar. 17, 2016 to Japanese Office Action; For Japanese Pat. App. No. 2015-013206; 7 pages.
Response to Chinese $2^{nd}$ Office Action dated Apr. 15, 2013 corresponding to Chinese Application No. 200980106535.4; Response filed on Jul. 11, 2013; 13 Pages.
Response to Chinese $3^{rd}$ Office Action dated Nov. 7, 2013 corresponding to Chinese Application No. 200980106535.4; Response filed on Jan. 7, 2014; 11 Pages.
Response to Chinese Office Action dated Aug. 29, 2012 corresponding to Chinese Application No. 200980106535.4; Response filed on Jan. 19, 2013; 14 Pages.
Response to Korean Office Action dated Jan. 30, 2015 corresponding to Korean Application No. 10-2014-7033792; Response filed on Mar. 23, 2015; 11 Pages.
Response to Korean Office Action dated Sep. 30, 2014 corresponding to Korean Application No. 10-2010-7019498; Response filed on Dec. 1, 2014; 32 Pages.
Response to Office Action dated Feb. 2, 2011 corresponding with U.S. Appl. No. 12/959,672; Response filed on May 24, 2011; 8 Pages.
Response to Office Action dated Jun. 30, 2010 corresponding to U.S. Appl. No. 12/037,393; Response filed on Oct. 13, 2010; 35 Pages.
Response to Office Communication filed on May 16, 2017 corresponding to U.S. Appl. No. 14/810,665; 2 pages.
Response to Restriction Requirement dated May 14, 2010 corresponding to U.S. Appl. No. 12/037,393; Response filed on Jun. 2, 2010; 1 Page.
Response to Restriction Requirement filed on Feb. 28, 2017 corresponding to U.S. Appl. No. 14/810,665; 1 Page.
Response to the First Examination Report filed on Sep. 6, 2017 for Indian Pat. Appl. No. 2318/KOLNP/2010; 37 pages.
Restriction Requirement dated May 14, 2010 corresponding to U.S. Appl. No. 12/037,393; 6 Pages.
Second Notice of Allowance dated Feb. 11, 2011 corresponding to U.S. Appl. No. 12/037,393; 8 Pages.
Second Notice of Allowance dated Jul. 19, 2011 corresponding with U.S. Appl. No. 12/959,672; 8 Pages.
Translation of Current Claims on file (as amended on Aug. 29, 2016) for JP 2015-013206; 2 pages.
PCT International Preliminary Report and Written Opinion dated Sep. 10, 2010 corresponding with Patent Application No. PCT/US2009/031776; 10 Pages.
PCT Search Report and Written Opinion of the ISA dated Aug. 11, 2010 corresponding with Patent Application No. PCT/US2010/024256; 14 Pages.
PCT Search Report and Written Opinion of the ISA dated Oct. 23, 2009 corresponding to Patent Application No. PCT/US2009/031776; 20 Pages.
Office Action dated Sep. 10, 2019 for German Application No. 112009000448.2 with English Translation; 23 Pages.
Response to German Office Action with English machine translation dated Jan. 17, 2020 for German Application No. 112009000448.2; 26 pages.
Restriction Requirement dated Jan. 31, 2017 for U.S. Appl. No. 14/810,665; 8 pages.
Office Action dated Jun. 6, 2017 for U.S. Appl. No. 14/810,665; 15 pages.
Notice of Allowance dated Aug. 30, 2017 for U.S. Appl. No. 14/810,665; 7 pages.

* cited by examiner

STRUCTURE AND SYSTEM FOR SIMULTANEOUS SENSING A MAGNETIC FIELD AND MECHANICAL STRESS

CROSS REFERENCE TO RELATED APPLICATIONS

This application is a Divisional Application of and claims the benefit of and priority to U.S. patent application Ser. No. 14/810,665 filed Jul. 28, 2015, which is incorporated herein by reference in its entirety.

FIELD OF THE INVENTION

This invention relates generally to magnetic field sensors and, more particularly, to magnetic field sensors having circuitry to sense and adjust a sensitivity of the magnetic field sensors to a magnetic field.

BACKGROUND

Magnetic field sensors employ a variety of types of magnetic field sensing elements, for example, Hall effect elements and magnetoresistance elements, often coupled to a variety of electronics, all disposed over a common substrate. A magnetic field sensing element (and a magnetic field sensor) can be characterized by a variety of performance characteristics, one of which is a sensitivity, which can be expressed in terms of an output signal amplitude versus a magnetic field to which the magnetic field sensing element is exposed.

The sensitivity of a magnetic field sensing element, and therefore, of a magnetic field sensor, is known to change in relation to a number of parameters. For example, the sensitivity can change in relation to a change in temperature of the magnetic field sensing element. As another example, the sensitivity can change in relation to a mechanical stress (or "strain") imposed upon the substrate over which the magnetic field sensing element is disposed. Such stress can be imposed upon the substrate at the time of manufacture of an integrated circuit containing the substrate. For example, the strain can be imposed by stresses caused by curing of molding compounds used to form an encapsulation of the substrate, e.g., a plastic encapsulation.

It will be recognized that changes in the temperature of a magnetic field sensor can directly result in changes of sensitivity due to the changes of temperature. However, the changes in the temperature of the magnetic field sensor can also indirectly result in changes of sensitivity where the temperature imparts strains upon the substrate over which the magnetic field sensing element is disposed.

The changes in sensitivity of the magnetic field sensor and of the magnetic field sensing element are undesirable.

SUMMARY

A magnetic field sensor, which includes a magnetic field sensing element, can measure, either directly or indirectly, a sensitivity of the magnetic field sensing element, and can adjust a sensitivity of the magnetic field sensor accordingly. Therefore, the magnetic field sensor maintains a sensitivity to magnetic fields that is generally invariant in the presence of temperature excursions or in the presence of manufacturing steps, both of which might otherwise tend to change the sensitivity of the magnetic field sensor.

In accordance with one aspect of the invention, a magnetic field sensor comprises a first magnetic field sensing element supported by a substrate, the first magnetic field sensing element having a first sensitivity to a magnetic field and a first sensitivity to mechanical stress in the substrate, the first magnetic field sensing element for generating a first output signal responsive to the magnetic field, the first magnetic field sensitivity, mechanical stress in the substrate, and the first mechanical stress sensitivity; a second magnetic field sensing element supported by the substrate, the second magnetic field sensing element having a second sensitivity to the magnetic field and a second sensitivity to mechanical stress in the substrate, the second magnetic field sensing element for generating a second output signal responsive to the magnetic field, the second magnetic field sensitivity, the mechanical stress in the substrate, and the second mechanical stress sensitivity; a stress compensation module operatively coupled to receive a first stress compensation input signal responsive to the first output signal and a second stress compensation input signal responsive to the second output signal and to generate a stress compensation signal; and an adjustable gain stage coupled to amplify the first output signal with a gain in accordance with the stress compensation signal to generate a stress-compensated output signal, wherein the stress-compensated output signal is responsive to the magnetic field, and is generally not responsive to the mechanical stress in the substrate.

In some embodiments, the stress compensation module is configured to calculate the gain using the first magnetic field sensitivity, the second magnetic field sensitivity, the first mechanical stress sensitivity, and the second mechanical stress sensitivity, wherein the stress compensation signal is based upon the gain.

In certain embodiments, the second mechanical stress sensitivity is approximately zero. The stress compensation module may be configured to calculate the gain using the first magnetic field sensitivity and the second magnetic field sensitivity, wherein the stress compensation signal is based upon the gain.

In various embodiments, the magnetic field sensor further comprises a first amplifier coupled to receive the first output signal and to generate the first stress compensation input signal and a second amplifier coupled to receive the second output signal and to generate the second stress compensation input signal. The first and second output signals may be responsive to a substrate temperature and the first and second stress compensation signals are generally not responsive to the substrate temperature. The magnetic field sensor may further include a threshold detector coupled to receive a threshold level signal and a threshold detector input signal responsive to the first output signal, the threshold detector configured to generate an enabling signal based upon the threshold level signal and the threshold detector input signal.

In some embodiments, the stress compensation module is coupled to receive the enabling signal and configured to calculate the gain in response to the enabling signal.

According to another aspect of the invention, a dual Hall element comprises a substrate having a bottom surface and a top surface; an N-type epitaxial layer disposed over the substrate top surface, the epitaxial layer having a top surface and a bottom surface; a barrier structure disposed over the substrate and extending perpendicular from the epitaxial layer top surface so as to form a barrier to electrical charges within the epitaxial layer and resulting in a bounded region of the epitaxial layer having a generally octagonal shape; a P-well region diffused into the epitaxial layer; and a plurality of pickups implanted and diffused into the epitaxial layer, opposing pairs of the plurality of pickups separated by the P-well region, each one of the plurality of pickups comprising an N+ type diffusion, wherein a first set of the plurality of pickups is operable to form a first Hall element and a second different set of the plurality of pickups is operable to form a second Hall element.

According to another aspect of the invention, a dual Hall element comprises a substrate having a bottom surface and a top surface; an N-type epitaxial layer disposed over the substrate top surface, the epitaxial layer having a top surface and a bottom surface; a barrier structure disposed over the substrate and extending perpendicular from the epitaxial layer top surface so as to form a barrier to electrical charges within the epitaxial layer; a P-well region diffused into the epitaxial layer; a first plurality of pickups implanted and diffused into the epitaxial layer, opposing pairs of the first plurality of pickups separated by the P-well region, each one of the first plurality of pickups comprising an N+ type diffusion; and a second plurality of pickups implanted and diffused into the P-well region, each one of the second plurality of pickups comprising an P+ type diffusion, wherein the first plurality of pickups is operable to form a first Hall element and the second plurality of pickups is operable to form a second Hall element.

According to another aspect of the invention, a dual Hall element comprises a bottom structure including: a substrate having a bottom surface and a top surface; an N-type epitaxial layer disposed over the substrate top surface, the epitaxial layer having a top surface and a bottom surface; a barrier structure disposed over the substrate and extending perpendicular from the epitaxial layer top surface so as to form a barrier to electrical charges within the epitaxial layer; a P-well region diffused into the epitaxial layer; and a first plurality of pickups implanted and diffused into the epitaxial layer, opposing pairs of the first plurality of pickups separated by the P-well region, each one of the first plurality of pickups comprising an N+ type diffusion; and a top structure electrically isolated from the bottom structure via an isolation region, the top structure including: a top layer; and a second plurality of pickups implanted and diffused into the top layer, wherein the first plurality of pickups is operable to form a first Hall element and the second plurality of pickups is operable to form a second Hall element.

In some embodiments, the top layer comprises a poly silicon material. In certain embodiments, each one of the second plurality of pickups comprises a P+ type diffusion. In some embodiments, each one of the second plurality of pickups comprises a N+ type diffusion.

According to another aspect of the invention, a dual Hall element comprises a substrate having a bottom surface and a top surface; an P-type epitaxial layer disposed over the substrate top surface, the epitaxial layer having a top surface and a bottom surface; an N-well region diffused into the epitaxial layer; a P-well region diffused into the N-well region; a first plurality of pickups implanted and diffused into the N-well region, opposing pairs of the first plurality of pickups separated by the P-well region, each one of the first plurality of pickups comprising an N+ type diffusion; and a second plurality of pickups implanted and diffused into the P-well region, each one of the second plurality of pickups comprising an P+ type diffusion, wherein the first plurality of pickups is operable to form a first Hall element and the second plurality of pickups is operable to form a second Hall element.

According to another aspect of the invention, a dual Hall element comprises: a substrate having a bottom surface and a top surface; an N-type epitaxial layer disposed over the substrate top surface; a first planar Hall element disposed within or over the epitaxial layer, the first planar Hall element having a first plurality of pickups with a first center between the first plurality of pickups; and a second planar Hall element disposed within or over the epitaxial layer, the second planar Hall element having a second different plurality of pickups with a second center between the second plurality of pickups, wherein the first and second centers are substantially collocated.

BRIEF DESCRIPTION OF THE DRAWINGS

The structures and techniques sought to be protected herein may be more fully understood from the following detailed description of the drawings, in which.

Figure 1:
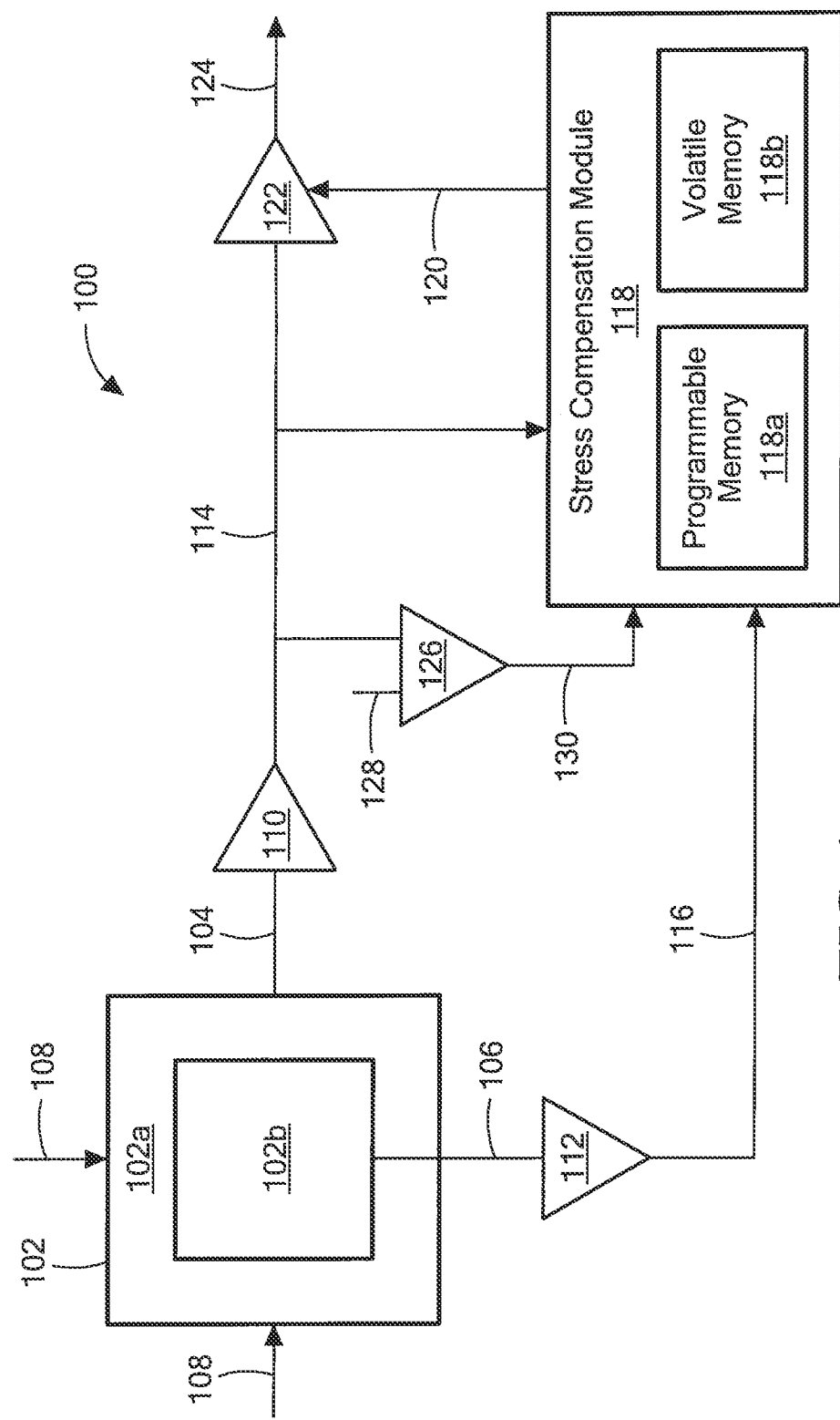
FIG. 1 is block diagram of an illustrative magnetic field sensor having a dual magnetic field sensing element, here a dual Hall effect element, coupled to a stress-compensation circuit.

The drawings are not necessarily to scale, or inclusive of all elements of a system, emphasis instead generally being placed upon illustrating the concepts, principles, systems, and techniques sought to be protected herein.

DETAILED DESCRIPTION

Before describing the present invention, some introductory concepts and terminology are explained. As used herein, the term "magnetic field sensor" is used to describe a circuit (which can include packaging thereof) that includes a "magnetic field sensing element." Magnetic field sensors are used in a variety of applications, including, but not limited to, a current sensor that senses a magnetic field generated by a current flowing in a current conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field. The term "magnetic field sensor" is used interchangeably herein with the phrase "circuit for sensing a magnetic field."

Hall effect elements are one type of magnetic field sensing elements. As is known, there are different types of Hall effect elements, for example, a planar Hall element, a vertical Hall element, and a Circular Vertical Hall (CVH) element. Magnetic field sensing elements are shown and described below to be planar (i.e., horizontal) Hall effect elements.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions).

A prior art planar (i.e., horizontal) Hall effect element is known to have four terminals. A current is driven between two opposing ones of the four terminals, and a differential voltage signal is generated as an output signal at the other two terminals. The differential voltage signal is responsive to a magnetic field.

The prior art planar Hall effect element can be used with so-called "current spinning", also referred to as "chopping." With current spinning, different opposing ones of the four terminals are used in sequence as the current driven terminals and different ones of the four terminals are used in the sequence as the output signal terminals.

The prior art Hall effect element, from a top view, can have a variety of shapes bounded by electrical isolation structures in a silicon substrate. Typically, the prior art Hall effect element has a square shape from a top view.

In contrast to the prior art Hall effect element, the term "dual Hall effect element" is used herein to describe a semiconductor structure having both a primary Hall effect element with at least four contacts and secondary Hall effect element with another at least four contacts. The primary and secondary Hall effect elements are collocated (e.g., overlaid) with each other such that the secondary Hall effect element lies within or over a perimeter of the primary Hall effect element, the perimeter defined by an outer boundary of an electrical isolation structure surrounding the primary Hall effect element. The primary and secondary Hall effect elements are arranged so as to be coincident in the direction of maximum magnetic field sensitivity and can be considered to be substantially collocated. In some embodiments, the primary and secondary Hall effect elements share a common isolation structure.

In some embodiments, at least one of the primary Hall effect element or the secondary Hall effect element can be used with current spinning/chopping.

As used herein, the term "epi" is used to refer to an epitaxial layer, for example, an N-type epitaxial layer, disposed over a substrate, for example, a P-type substrate, and having a particular range of concentrations of N-type atoms (i.e. ions). As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "P-well" is used to refer to a region implanted and diffused into a semiconductor layer, for example, into a surface of the epitaxial layer furthest from the substrate, and having a particular range of concentrations of P-type atoms (i.e. ions). As used herein, the term "P-type barrier layer" or simply "PBL" is used to refer to a region implanted and diffused into a semiconductor layer, for example, implanted into the substrate and then upwardly diffused into the epitaxial (epi) layer. The epi layer can be grown after PBL implant and diffusion steps, and the upward diffusion into epi layer can be performed during a field oxidation process.

As used herein, the term "N-well" is used to refer to a region implanted and diffused into a semiconductor layer, for example, into a surface of the epitaxial layer furthest from the substrate, and having a particular range of concentrations of N-type atoms (i.e. ions).

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures fall into the following ranges:
  substrate: about $1 \times 10^{15}$ P-type atoms per cm$^3$, for example, boron atoms;
  n-type epi: about $5 \times 10^{14}$ to about $1 \times 10^{16}$ N-type atoms per cm$^3$, for example, Arsenic atoms, where: $5 \times 10^{14}$ can be representative of a concentration of epi bulk doping, and $1 \times 10^{16}$ can be representative of a concentration at a surface region of the epi layer at about 2 um depth created by an additional epi implant step (Alternatively, $1 \times 10^{15}$ to $6 \times 10^{15}$);
  P-type epi: about $1 \times 10^{16}$ to $5 \times 10^{16}$ atoms per cm$^3$, for example, boron atoms;
  N+: about $1 \times 10^{20}$ N-type atoms per cm$^3$, for example, phosphorous atoms;
  P-well: about $6 \times 10^{16}$ to $2 \times 10^{17}$ P-type atoms per cm$^3$ or about $5 \times 10^{17}$ to $1 \times 10^{18}$ P-type atoms per cm$^3$ for example, boron atoms;
  N-well: about $3 \times 10^{16}$ to $1 \times 10^{17}$ N-type atoms per cm$^3$, for example, boron atoms;
  PBL: about $1 \times 10^{18}$ to about $2 \times 10^{18}$ P-type atoms per cm$^3$, for example, boron atoms; and
  P+: about $3 \times 10^{19}$ to about $5 \times 10^{19}$ P-type atoms per cm$^3$, for example, boron atoms.

In some embodiments, the concentrations are outside of the above ranges or values, but within about +/− twenty percent of the above ranges or values.

Before describing the present invention, it should be noted that reference is sometimes made herein to assemblies having a particular shape (e.g., square or octagonal). One of ordinary skill in the art will appreciate, however, that the techniques described herein are applicable to assemblies having a variety of sizes and shapes.

Referring to FIG. 1, an illustrative magnetic field sensor 100 for sensing a magnetic field includes a dual magnetic field sensing element 102 comprising magnetic field sensing elements 102a, 102b. In various embodiments, the dual magnetic field sensing element 102 is a dual Hall effect element 102 comprising a primary Hall effect element 102a and a secondary Hall effect element 102b. The primary and secondary Hall effect elements 102a, 102b are coupled to receive drive currents from respective current sources (not shown) and configured to generate respective primary and secondary output signals 104, 106 sensitive to an applied magnetic field 108.

In some embodiments, each one of the output signals 104, 106 is a differential signal. Accordingly, the amplifiers 110, 112 may comprise differential amplifiers.

It should be understood that the signals 104, 106 (along with various other signals shown in FIG. 1 and described herein) are carried via respective signal paths shown in FIG. 1 using identical reference designators. For simplicity of explanation, signals and their respective signal paths are referred to interchangeably herein.

In embodiments, the primary and secondary Hall effect elements 102a, 102b are provided within a common structure 102. The common structure 102 may comprise a dual Hall effect element supported by a common substrate and also disposed within or over a common outer electrical isolation barrier.

In the embodiment shown, the primary output signal 104 is coupled to a first amplifier 110 to generate a primary (or "first") amplified signal 114 and the secondary output signal 106 is coupled to a second amplifier 112 to generate a secondary (or "second") amplified signal 116. In some embodiments, the gain of amplifiers 110 and/or 112 is based on a trim value stored in programmable memory, such as erasable programmable read-only memory (EEPROM).

The primary and secondary amplified signals 114, 116 are operatively coupled to a stress compensation module 118 and are therefore also referred to as first and second stress compensation input signals 114, 116, respectively. In other embodiments, amplifiers 110 and/or 112 may be omitted and, thus, the first and second stress compensation input signals 114, 116 correspond to primary and secondary output signals 104, 106, respectively.

The stress compensation circuit 118 processes the input signals 114, 116 to generate a gain compensation signal 120. The gain compensation signal 120 is coupled to an adjustable gain stage 122 to modulate (i.e., change a gain of) an output voltage from the primary Hall effect element 102a to generate a stress-compensated output signal 124. In the embodiment shown, amplified signal 114 is modulated by the adjustable gain stage 122; in other embodiments, the primary output signal 104 is modulated. The gain compensation signal 120 results in a control of a sensitivity of the magnetic field sensor 100, as described herein below.

In some embodiments, the magnetic field sensor 100 further comprises a threshold detector 126. The threshold detector 126 may be coupled to receive a threshold level signal 128 and the primary amplified signal 114, and configured to generate an enabling signal 130, which may be coupled as input to the stress compensation module 118. If the primary amplified signal 114 exceeds a threshold level indicated by the threshold signal 128, the generated enabling signal 130 has a first state (e.g., non-zero voltage value); otherwise the generated enabling signal 130 has a second different state (e.g., zero voltage).

The stress compensation module 118 includes any combination of hardware and/or software configured to operate as described herein below. In some embodiments, the stress compensation module 118 comprises an application-specific integrated circuit (ASIC). In other embodiments, the stress compensation module 118 comprises a processor configured to read and execute software instructions. In some embodiments, the stress compensation module 118 can be embodied in a discrete electronic circuit, which can be an analog or digital. In the embodiment shown, the stress compensation module 118 includes programmable memory 118a (e.g., EEPROM) and volatile memory 118b.

The output voltage of a Hall element is proportional to the magnetic field times the element's field sensitivity. Ideally, the field sensitivity is a constant value. However, in realistic operation conditions, the magnetic field sensitivity of a Hall effect element can vary (or "shift") with temperature and/or due to mechanical stresses in the substrate. Accordingly, the output voltage of the primary and secondary Hall effect elements 102a, 102b (i.e., the primary and secondary output signals 104, 106) may have sensitivities that are changed by temperature- and/or stress-induced sensitivity shifts.

Any suitable technique can be used to compensate for temperature-induced sensitivity shifts. For example, prior to general operation, the sensitivity shift of each Hall element 102a, 102b can be measured at several different temperatures. Such measurements can be stored in programmable memory (e.g., EEPROM) and used to adjust to gain of amplifiers 110, 112 based on a current temperature, thereby correcting for temperature-induced sensitivity shift.

Assuming that temperature-induced sensitivity shifts have been corrected and ignoring offset effects, the output voltage for a given Hall element is approximately equal to the product of the magnetic field B and the field sensitivity of the Hall element, modulated by (i.e., changed by) the product of the stress and the stress sensitivity. Formally, the output voltage of the primary Hall element 102a can be expressed as:

$$V_1 = B \times \text{field\_sensitivity}_1 \times [1 + (\text{stress} \times \text{stress\_sensitivity}_1)] \qquad (1)$$

and the output voltage of the secondary Hall element 102b can be expressed as:

$$V_2 = B \times \text{field\_sensitivity}_2 \times [1 + (\text{stress} \times \text{stress\_sensitivity}_2)] \qquad (2)$$

where:
B corresponds to a strength of the magnetic field 108,
stress corresponds to mechanical stress in the substrate,
field_sensitivity$_1$ is the sensitivity of the primary Hall element 102a to the magnetic field,
stress_sensitivity$_1$ is the sensitivity of the primary Hall element 102a to stress,
field_sensitivity$_2$ is the sensitivity of the secondary Hall element 102b to the magnetic field, and
stress_sensitivity$_2$ is the sensitivity of the secondary Hall element 102b to mechanical stress.

In the above equations, it is assumed that the magnetic field sensitivities (i.e., field_sensitivity$_1$ and field_sensitivity$_2$) have been corrected for temperature-induced shifts. As discussed above, this can be achieved by controlling the gain of amplifiers 110, 112. Thus, in some embodiments, the primary Hall output voltage $V_1$ may correspond signal 114 and the secondary Hall output voltage $V_2$ may correspond to signal 116. In other embodiments, the primary Hall output voltage $V_1$ may correspond signal 104 and the secondary Hall output voltage $V_2$ may correspond to signal 106.

From equations (1) and (2), the stress can be determined as follows:

$$\text{stress} = \frac{[(\text{field\_sensitivity}_2 \times V_1) - (\text{field\_sensitivity}_1 \times V_2)]}{\left[\begin{array}{l}(\text{field\_sensitivity}_1 \times V_2 \times \text{stress\_sensitivity}_1) - \\ (\text{field\_sensitivity}_2 \times V_1 \times \text{stress\_sensitivity}_2)\end{array}\right]} \qquad (3)$$

and the undesirable stress effects can be compensated for by modulating the primary output voltages 104 by a gain calculated as follows:

$$\text{gain} = 1/[1 + (\text{stress} \times \text{stress\_sensitivity}_1)] \qquad (4)$$

In the case where the secondary Hall effect element 102b is generally immune to stress effects (i.e., stress_sensitivity$_2 \cong 0$), a gain is independent of stress and stress sensitivities and can be determined as:

$$\text{gain} = (\text{field\_sensitivity}_1 \times V_2)/(\text{field\_sensitivity}_2 \times V_1) \qquad (5)$$

In equation (5), the gain is proportional to $V_2$ (i.e., the secondary output voltage 106). Accordingly, error in $V_2$ leads to proportional error in the gain and error, as a percentage, is most pronounced when $V_2$ is small (i.e., when the gain of the secondary Hall element 102b is low). Thus, it makes sense to update the correction factor (gain) only when the magnitude of $V_2$ is substantially larger then the error in $V_2$—i.e., in the case of a high signal-to-noise ratio (SNR).

One approach for achieving high SNR is to ensure a sufficiently large magnetic field B by comparing a Hall output voltage to a threshold value. For example, the primary Hall output voltage (signal 104 or 114) can be compared to a threshold level 128 using threshold detector 126. Another approach for achieving high SNR is to ensure a sufficiently small error by limiting the bandwidth of output signals 104, 106. Assuming the errors are not disproportionally concentrated in the bandwidth where the output voltages are being measured, this approach works well for thermal noise and other environment noise, however care must be taken to limiting the impact of sampling noise effects. Any suitable filtering techniques may be used for bandwidth limiting. In some embodiments, the Hall output voltages have a bandwidth between 100 KHz and 1 MHz, and the stress compensation module input signals 114, 116 have a bandwidth between 1 Hz and 100 Hz. It will be appreciated that there is a balance between the strength of the magnetic field B and the signal bandwidth. If the field is strong, wider bandwidths can be used and a short duration is necessary to achieve sufficiently high SNR. On the other hand, if the magnetic field is weak, a narrower bandwidth should be used to achieve high SNR.

During operation, the primary and secondary Hall effect elements 102a, 102b are assumed to be subject to generally the same mechanical stress, in particular, because they are substantially collocated. In addition, the primary and secondary Hall effect elements 102a, 102b can be arranged so that respective directions of maximum magnetic field sensitivity are substantially parallel to each other.

In embodiments, the magnetic field sensitivities and the stress sensitivities are unique for each Hall element 102a, 102b. In some embodiments, the products $stress\_sensitivity_1 \times field\_sensitivity_2$ and $stress\_sensitivity_2 \times field\_sensitivity_1$ are unique.

The magnetic field sensitivity values $field\_sensitivity_1$ and $field\_sensitivity_2$ and/or the stress sensitivity values $stress\_sensitivity_1$ and $stress\_sensitivity_2$ can be determined prior to operation and stored in programmable memory 118a.

In operation, the Hall effect elements 102a and 102b generate respective output signals 104 and 106 in response to a magnetic field 108. The output signals 104 and 106 may be trimmed and/or corrected for temperature-induced sensitivity shift via respective amplifiers 110 and 112. The resulting amplified signals 114 and 116 are provided as input to the stress compensation module 118. Using the a priori sensitivity values (e.g., values stored in programmable memory 118a), the compensation module 118 may apply equation (3) to determine mechanical stress and calculate a gain compensation value using equation (4) to generate gain compensation signal 120. Alternatively, in the case where the secondary Hall effect element 102b is generally immune to stress effects (i.e., $stress\_sensitivity_2 \cong 0$), the compensation module 118 may calculate a gain directly using equation (5) to generate gain compensation signal 120. In turn, the adjustable gain stage 122 can modulate an output voltage from the primary Hall effect element 102a (i.e., signal 104 or signal 114) with the gain compensation signal 120 to generate a stress-compensated output signal 124.

It should be appreciated that the stress-compensated output signal 124 is responsive to the strength of the magnetic field 108 multiplied by the magnetic field sensitivity of the primary Hall effect element 102a and is generally not responsive to the effects of temperature and mechanical stress.

In certain embodiments, the stress compensation module 118 updates the gain compensation value and corresponding gain compensation signal 120 in a continuous manner, meaning that the input signals 114 and 116 are continuously evaluated—i.e., using equations (3) and (5), or equation (5)—to determine a gain, and that the gain compensation signal 120 is continuously updated based on the gain.

In other embodiments, the stress compensation module 118 updates the gain compensation value and corresponding gain compensation signal 120 in a discontinuous manner.

If the inputs 114, 116 to the stress compensation module have low SNR, then the resulting gain compensation signal 120 could be effectively random (i.e., close to 100% in error) resulting in poor measurements from the circuit 100. As discussed above, one approach to preventing such measurement errors is to ensure that the primary Hall output voltage (i.e., signal 104 or signal 114) exceeds a threshold value. Accordingly, in some embodiments, the stress compensation module 118 recalculates the stress and gain compensation signal 120 only when the threshold detector 126 indicates this condition via enabling signal 130.

In addition to minimizing measurement errors, it may be desirable to throttle the rate at which the gain compensation signal is recalculated so as to reduce average power consumption. Between updates, the stress compensation module 118 may store the previous calculated gain compensation value in volatile memory 118b. If the case of infrequent updates, it may be preferable to re-calculate the gain compensation rather than use an obsolete stored value. Thus, in some embodiments a timer is provided to expire the stored gain compensation value after a predetermined amount of time.

Figure 2:
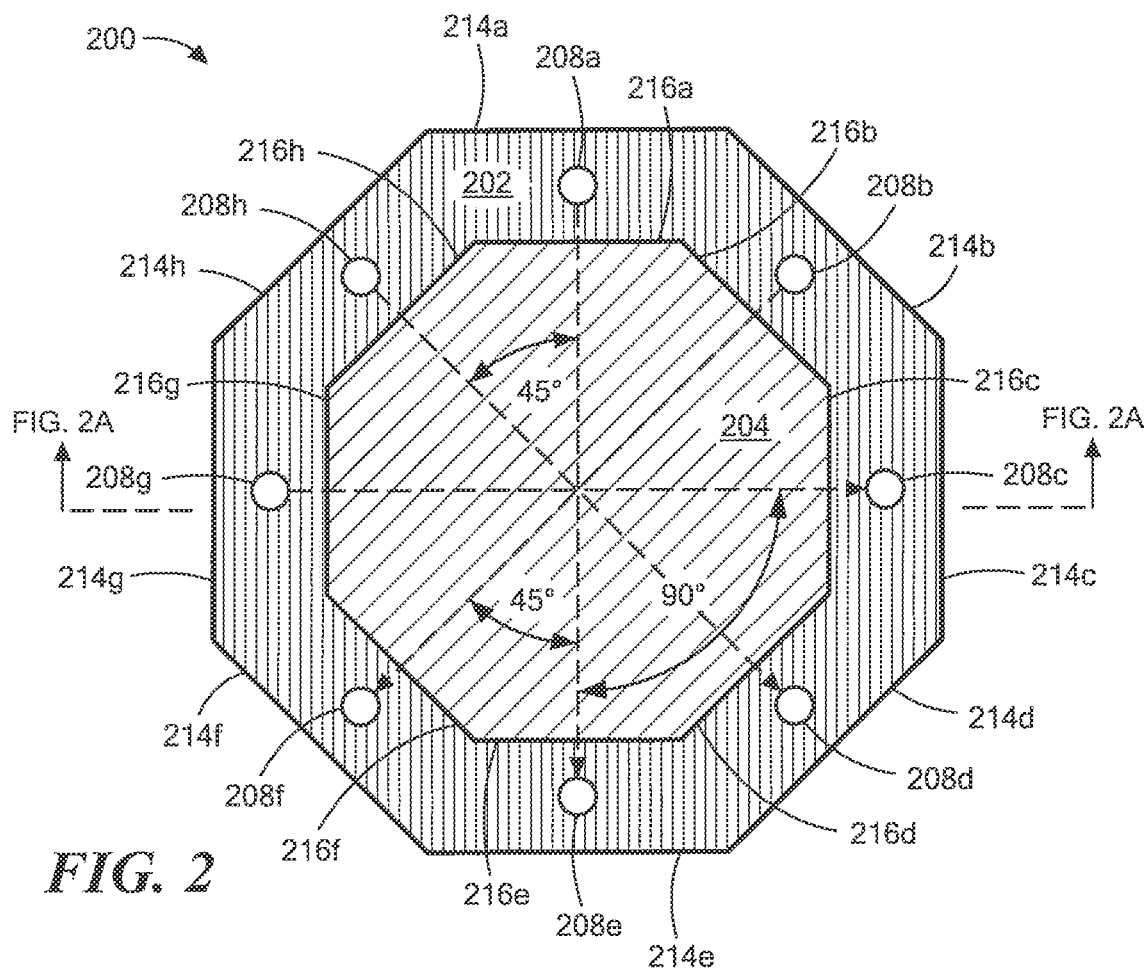
FIG. 2 is a top-view of an illustrative dual Hall effect element having two sets of pickups separated by a P-well region.
Figure 2A:
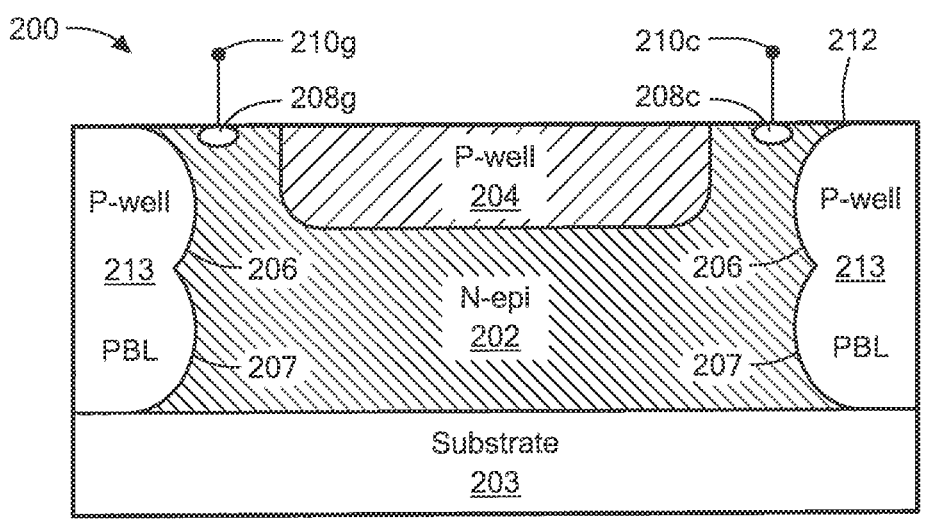
FIG. 2A is a side-view of the dual Hall effect element of FIG. 2.

Referring to FIGS. 2 and 2A together, for which FIG. 2 shows a top view of FIG. 2A, and in which like elements are shown having like reference designations, an illustrative dual Hall effect element 200 may be the same as or similar to the dual Hall effect element 102 of FIG. 1. The illustrative dual Hall effect element 200 may be representative of a Hall plate at an intermediate step of integrated circuit fabrication. In particular, the dual Hall effect element 200 does not show additional layers and structures that may be formed over a typical Hall effect element. In addition, the dual Hall effect element 200 does not show some structures that are temporary, for example, photo resist masks, which can be removed during the fabrication process. Accordingly, reference may be made below to patterning that uses photo resist masks to provide openings for implant steps. However, in other instances described below, a field oxide layer can be used to provide openings for some implant and diffusion steps.

The dual Hall effect element 200 can be constructed over a substrate 203, in particular, within and upon an epitaxial ("epi") region (or "layer") 202 disposed upon the substrate 203. In this example, the epi region 202 is an N-type epi region. The dual Hall effect element 200 includes a plurality of pickups 208 (with eight pickups 208a-208h shown in this example) implanted and diffused into the epi region 202. In some embodiments, one or more of the plurality of pickups 208 comprises an N+ type diffusion.

It will be appreciated that the dual Hall effect element 200 is a dual planar (i.e., horizontal) Hall effect element. As is known in the art, planar Hall elements have an axis of maximum magnetic field sensitivity that is perpendicular to a substrate on which the planar Hall element is formed.

In certain embodiments, the dual Hall effect element 200 includes an inner P-well region 204 diffused into the epi region 202, as shown. Opposing pairs of pickups (e.g., pickups 208a and 208e) may be separated by the inner P-well region 204. It will be understood that including an inner P-well region 204 may provide certain advantages. In operation, the inner P-well region 204 tends to cause the current flowing between opposing pairs of pickups to flow under the P-well region 204. As is known, Hall sensitivity is proportional to carrier mobility, which is inversely related to dopant density. Since the dopant density is highest near a surface 212 of the epi region 202, the current would (without the P-well region 204) tend to flow nearer the surface 212, resulting in a relatively low Hall sensitivity. Thus, the P-well region 204 forces currents lower in the epi region 202 (i.e., closer to the substrate 203) where mobility is higher, thus improving the sensitivity of the planar Hall element. In some embodiments, the epi region 202 has a generally uniform, low dopant-density, and thus a P-well region 204 is unnecessary.

In the side-view of FIG. 2A, pickups 208g and 208c are visible, pickups 208d-208f are not visible, and pickups 208h, 208a, and 208b are hidden behind the inner P-well region 204.

As used herein, the term "pickup" is used to describe an active region, here and N+ active region, implanted and diffused into a semiconductor structure, i.e., into an outer surface of the epi region 202, and which is used to provide an area at which an electrical signal is received from the semiconductor structure or at which an electrical signal is input to the semiconductor structure. In particular, a pickup (e.g., pickup 208a) is an active or device region first defined by a "device" photo resist mask, which is thereafter removed.

Associated with each one of the pickups (e.g., pickup 208a) is a so-called "contact," of which contacts 210c, 201g are representative. As used herein, the term "contact" is used to describe a metallized connection of a semiconductor structure, for example, metal plating or layer (not shown) over contact openings. A contact (e.g., contact 210c) provides a low resistance electrical coupling to a corresponding pickup (e.g., pickup 208c). While one contact is shown for each pickup, in other embodiments, there can be a plurality of contacts in electrical communication with an associated pickup. In some embodiments, associated with and electrically coupled to each one of the contacts 210, is a metal structure. Such a metal structure may correspond to a portion of a metal layer of a semiconductor structure used to provide a low resistance electrical coupling to a contact.

An outer horizontal boundary of the epi region 202 is determined by an inner edge (closest to the pickups 208) of an outer P-well region 206 that surrounds the pickups 208. The outer P-well region 206 is implanted and diffused into the epi region 202 from a top surface of the epi region 202 (i.e., the surface furthest from the substrate 203). It will be understood that the edges of the outer P-well region 206 may be altered as the region 206 is diffused during fabrication of the dual Hall effect element 200. In some embodiments, the outer P-well region 206 results from an implant formed in conjunction with a photo resist mask that provides openings for the implantation, and which is later removed. In some embodiments, the P-well implant is performed prior to growth of a field oxide layer.

A PBL structure 207 is diffused within the epi region 202 and over the substrate 203 before placement of the epi region 202. It will be understood that the edges of the PBL structure 207 may be altered as the region 206 is diffused during fabrication of the dual Hall effect element 200. The PBL structure 207 joins with or merges with the outer P-well region 206 forming a barrier structure (or "isolation region") 213 to electrical isolate charges that move within the epi region 202 during operation of the dual Hall effect element 200.

Placement of a device photo resist mask (not shown) and implantation of the pickups 208 can be preceded by formation of a field oxide layer (not shown) over a top surface 212 of the epi region 202. Openings can be provided (i.e., etched) through the field oxide layer by way of the device photo resist mask, the openings for implantation of the pickups 208. Openings through the field oxide layer may be provided over the outer P-well region 206 for a masked P+ implant.

The illustrative dual Hall effect element 200 includes a major planar surface (shown in FIG. 2) that can have an outer perimeter 214 having a generally octagonal shape. The outer perimeter 214 is comprised of eight sides 214a-214h of generally equal length. The sides 214a-214h are defined by edges of the respective epi regions 202 bounded by respective isolation regions 213, for example by outer P-well region 206 and PBL structure 207. In addition, the dual Hall effect element 200 includes an inner perimeter 216 also having a generally octagonal shape, which perimeter 216 is defined by a boundary between the inner P-well region 204 and the epi region 202. The inner perimeter 216 can be comprised of eight sides 216a-216h of generally equal length. In embodiments, a representative outer side 214a has a length between 60-100 microns, and a representative inner side 216a has a length between 40-80 microns. The outer and inner octagonal perimeters 214, 216 may be aligned such that each outer side 214a-214h is generally parallel to one of the inner sides 216a-216h. The outer and inner octagonal perimeters 214, 216 may also be aligned such that centers of the outer and inner octagonal perimeters 214, 216 (i.e., centers of the first and second sets of pickups 208a, 208c, 208e, 208g and 208b, 208d, 208f, 208h) are substantially collocated.

In some embodiments, ones of the plurality of contacts 210a-210h (and corresponding pickups 208a-208h) are provided between each of the eight pairs of sides, as shown. For example, the representative pickup 208a may be diffused in the epi region 202 between the outer perimeter side 214a and the inner perimeter side 216a.

The substrate upon which the Hall effect element (e.g., the dual Hall effect element 200) is formed has a so-called Miller index (i.e., plane) that characterizes a direction of crystalline structures within the substrate. Miller indices and Miller directions are known and are not further taught herein. It is known that electrical currents tend to favor a direction of travel in a substrate. In other words, in particular directions of flow relative to a crystalline structure of a substrate, a substrate has lowest plate resistance. For this reason and for additional reasons described below, lines joining opposing pairs of the electrical contacts are in particular directions described more fully below.

The dual Hall effect element 200 has two sets of pickups (two sets of four pickups in this example). The first set includes pickups 208a, 208c, 208e, and 208g and may correspond to the primary Hall effect element 102a of FIG. 1. The second set includes pickups 208b, 208d, 208f, and 208h, and may correspond to the secondary Hall effect element 102b of FIG. 1. The first set of four pickups includes two opposing pairs of pickups (e.g., pickups 208a and 208e, and pickups 208c and 208g), either of which can be electrically coupled to the primary amplifier 110 (FIG. 1) at a given time. Likewise, the second set of four pickups includes two opposing pairs of pickups (e.g., pickups 208b and 208*f*, and pickups 208*d* and 208*h*), each of which can be electrically coupled to the secondary amplifier 112 (FIG. 1) at a given time.

The orientation of the pickups 208 may be selected such that pairs of contacts from the first set are oriented along lines at forty-five degree angles from pairs of contacts from the second set. For example, as shown in FIG. 2, pickups 208*a* and 20*e*8 are orientated along one line, pickups 208*b* and 208*f* are orientated along a different line, and those lines are at a forty-five degree angle to each other.

In the example of FIG. 2, the primary and secondary Hall effect elements 102*a*, 102*b* share a common magnetic field sensing layer (i.e., epi layer 202) and, thus, may have substantially the same magnetic field response in the absence of stress (i.e., $field\_sensitivity_1 \cong field\_sensitivity_2$). However, because opposing pairs of pickups of the primary Hall effect element 102*a* are oriented forty-five degrees relative to opposing pairs of pickups from the secondary Hall effect element 102*b*, the Hall effect elements 102*a*, 102*b* will have different sensitivities to stress (i.e., $stress\_sensitivity_1 \neq stress\_sensitivity_2$) due to Miller indices/directions and other crystallographic properties. In some embodiments, the primary Hall effect element 102*a* is more sensitive to mechanical stress; in other embodiments, the secondary Hall effect element 102*b* is more sensitive to mechanical stress.

It will be appreciated from discussion above that, by measuring the output of both the primary and the secondary Hall effect elements 102*a*, 102*b*, the stress state of the silicon may be deduced and appropriate corrections made to the magnetic field sensor 100 output.

In some embodiments, the magnetic field sensor 100 of FIG. 1 uses a "chopping" technique. It will be understood that chopping is an arrangement by which at some times a selected pickup of a Hall effect element is driven and at other times a different selected pickup is driven. Similarly, at some times an output signal is generated between a first pair of the pickups, and at other times an output signal is generated between the second pair of the pickups. The second pair of pickups may be arranged along a line perpendicular to that of the first pair of pickups. It will further be understood that the chopping arrangement is often used with planar Hall effect elements to result in a reduction of the DC offset voltage.

For a dual Hall effect element, such as the dual Hall effect element 102 of FIG. 1, both the primary and secondary Hall effect elements 102*a*, 102*b* may be "chopped." For example, referring specifically to FIGS. 2 and 2A, the primary Hall effect element 102*a* may alternately be driven via opposing pairs of contacts 210*a* and 210*e*, and contacts 210*c* and 210*g*. Likewise, the secondary Hall effect element 102*b* may alternate driven via opposing pairs of contacts 210*b* and 210*f*, and contacts 210*d* and 210*h*. Such alternations may occur in unison, meaning the pickups used to generate the primary output signal are alternated generally at the same time as the pickups used to generate the secondary output signal.

It should be understood that the dual Hall effect element 200 shown in FIGS. 2 and 2A is merely one example of a dual Hall effect element for use with the magnetic field sensor 100 of FIG. 1. Additional examples are shown in FIGS. 3, 3A, 4, 4A, 5, and 5A and described below in conjunction therewith.

Figure 3:
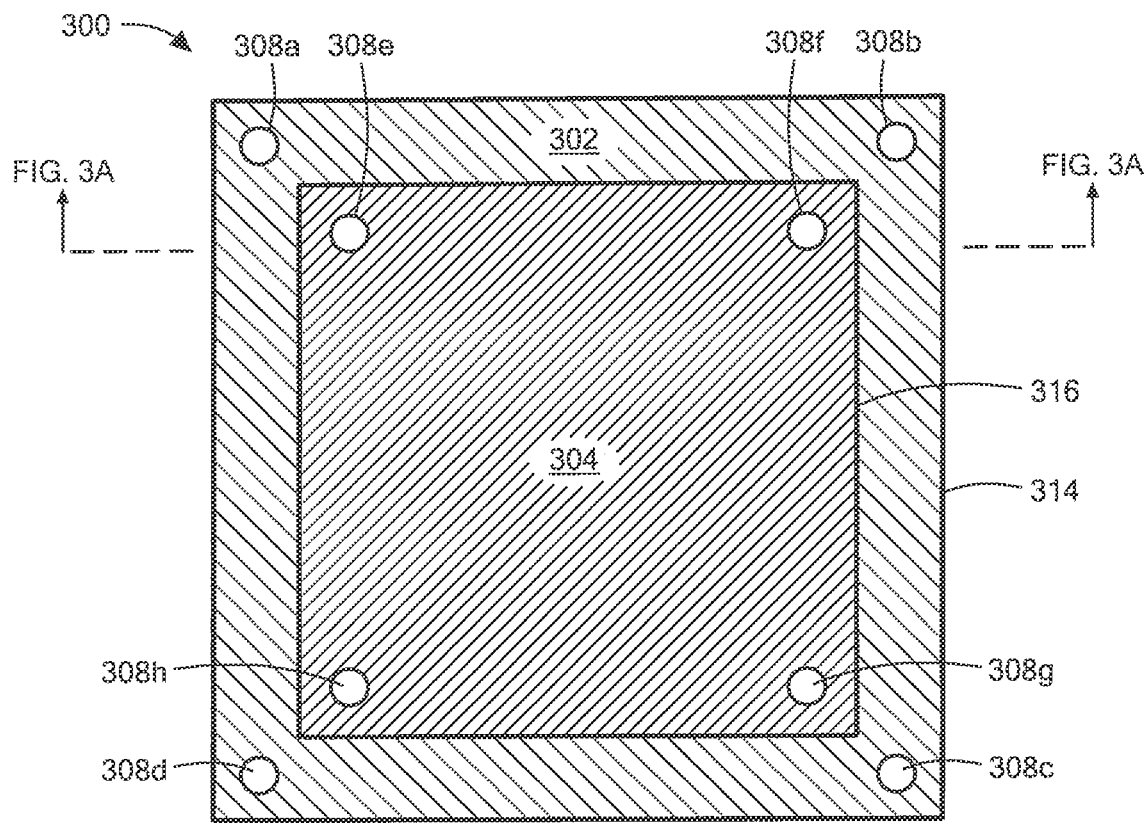
FIG. 3 is a top-view of another illustrative dual Hall effect element having one set of pickups separated by a P-well region and one set of pickups disposed within the P-well region.
Figure 3A:
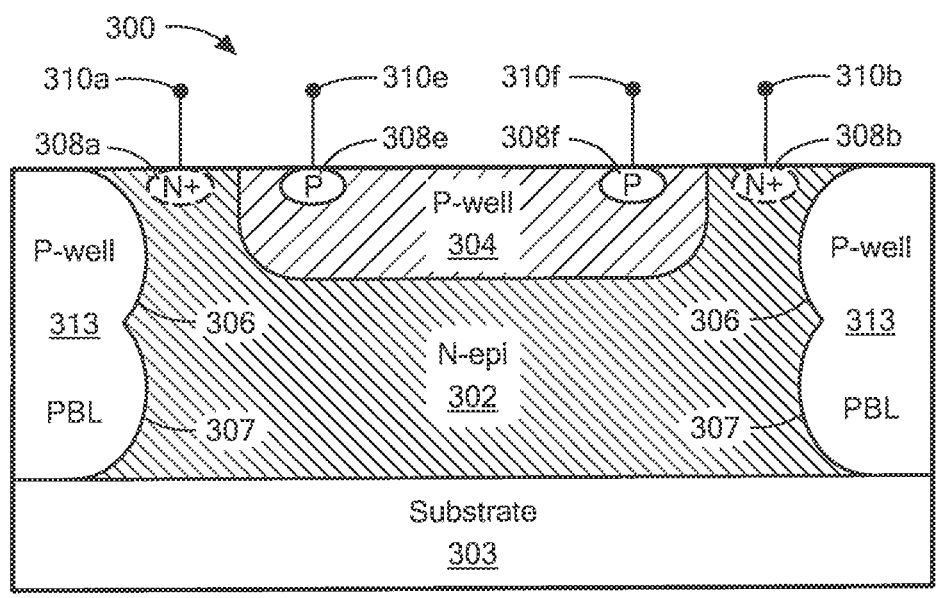
FIG. 3A is a side-view of the dual Hall effect element of FIG. 3.

Referring to FIGS. 3 and 3A together, for which FIG. 3 shows a top view of FIG. 3A, and in which like elements are shown having like reference designations, an illustrative dual Hall effect element 300 may be the same as or similar to the dual Hall effect element 102 of FIG. 1. The illustrative dual Hall effect element 300 may be fabricated similar to dual Hall effect element 200, as described above in conjunction with FIGS. 2 and 2A. In particular, the dual Hall effect element 300 comprises an N-type epi region 302 disposed over a substrate 303, an inner P-well region 304 implanted and diffused into the epi region 302, an outer P-well region 306 implanted and diffused into the epi region 302 to form an outer horizontal boundary thereof, and a PBL structure 307 diffused within the epi region 302 and over the substrate 303, wherein the PBL structure 307 joins/merges with the outer P-well region 306 forming a barrier structure (or "isolation region") 313.

The dual Hall effect element 300 includes a first set of pickups 308*a*-308*d* implanted and diffused within the epi region 302 and a second set of pickups 308*e*-308*h* implanted and diffused within the inner P-well region 304. In this example, opposing pairs of pickups from the first set (i.e., pickups 308*a* and 308*c*, and pickups 308*b* and 308*d*) are separated by the inner P-well region 304 and opposing pairs of pickups from the second set (i.e., pickups 308*e* and 308*g*, and pickups 308*f* and 308*h*) are diffused within the inner P-well region 304. In some embodiments, each one of the first set of pickups 308*a*-308*d* comprise an N+ type diffusion, whereas each one of the second set of pickups 308*e*-308*h* comprise a P+ type diffusion. The dual Hall effect element 300 further includes a plurality of contacts 310*a*-310*h*, each of which is associated with one of the pickups 308*a*-308*h*. In the side-view of FIG. 3A, only pickups 308*a*, 308*e*, 308*f*, and 308*b* and respective contacts 310*a*, 310*e*, 310*f*, and 310*b* are visible.

It will be appreciated that the illustrative dual Hall effect element 300 is a dual planar (i.e., horizontal) Hall effect element.

The illustrative dual Hall effect element 300 includes a major planar surface (shown in FIG. 3) having an outer perimeter 314 with a generally square shape. The perimeter 314 may be defined by edges of the epi region 302 bounded by the isolation region 313. In addition, the dual Hall effect element 300 includes an inner perimeter 316 also having a generally square shape and being defined by a boundary between the inner P-well region 304 and the epi region 302.

In some embodiments, a pickup and corresponding contact are provided at each corner of the outer perimeter 314, as shown.

The first set of pickups 308*a*-308*d* disposed within the epi region 302 may correspond to the primary Hall effect element 102*a* (FIG. 1), whereas the second set of pickups 308*e*-308*h* disposed within the inner P-well 304 may correspond to the secondary Hall effect element 102*b*. Because the sets of pickups are disposed within different types of materials, the magnetic field sensitivities of the corresponding primary and secondary Hall effect elements will generally be different (i.e., $field\_sensitivity_1 \neq field\_sensitivity_2$).

As with the illustrative dual Hall effect element 200 of FIG. 2, the primary and secondary Hall effect elements corresponding to the dual Hall effect element 300 are arranged so axes of maximum magnetic field sensitivity are parallel, centers of the two perimeters are substantially collocated, and both share a common isolation region.

Thus, by simultaneously obtaining differential Hall outputs from a first pair of contacts disposed within N-type epi 302 and a second pair of contacts disposed within P-well 304, the stress state of the silicon may be deduced and appropriate corrections made to the magnetic field sensor 100 of FIG. 1.

As discussed above, a dual Hall effect element can be chopped. Referring to the dual Hall effect element 300 of FIG. 3, the primary Hall effect element 102a may alternately be driven via opposing pairs of contacts 310a and 310c, and contacts 310b and 310d. Likewise, the secondary Hall effect element 102b may alternately driven via opposing pairs of contacts 310e and 310g, and contacts 310f and 310h.

Figure 4:
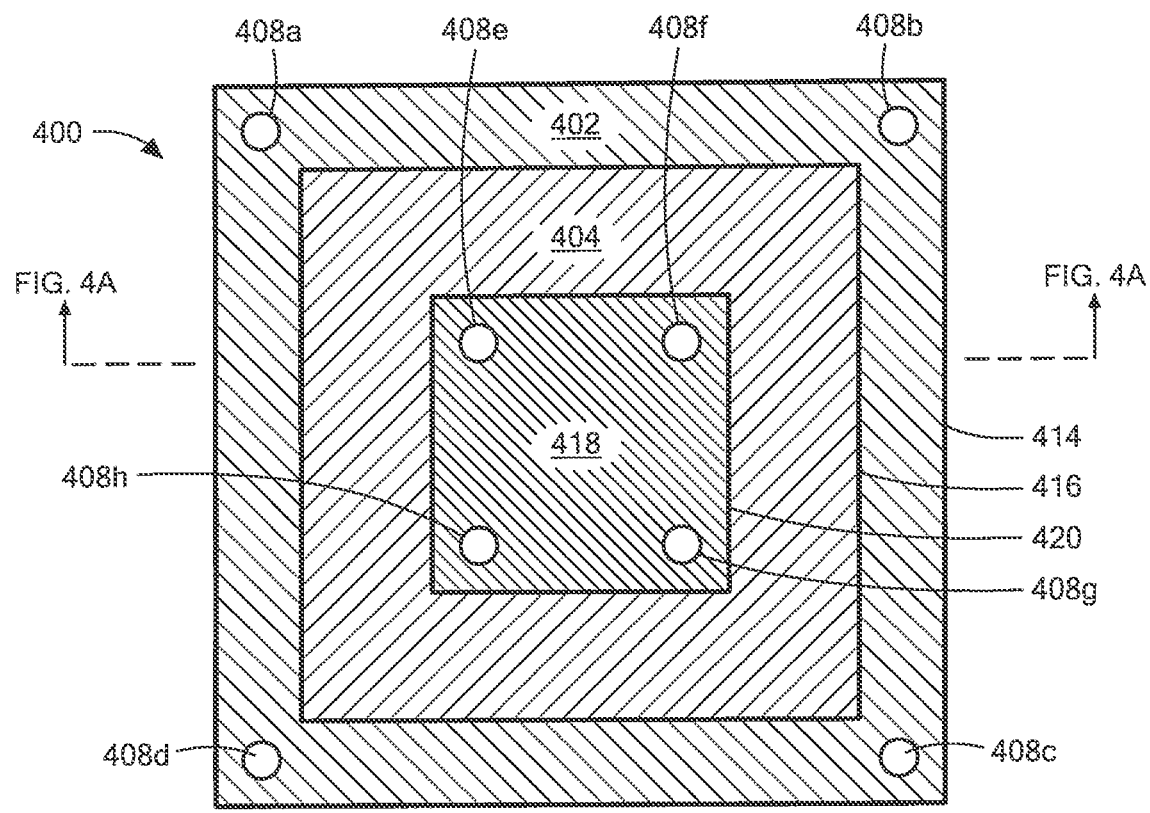
FIG. 4 is a top-view of yet another illustrative dual Hall effect element having one set of pickups separated by a P-well region and one set of pickups disposed upon a top structure deposited on top of the P-well region.
Figure 4A:
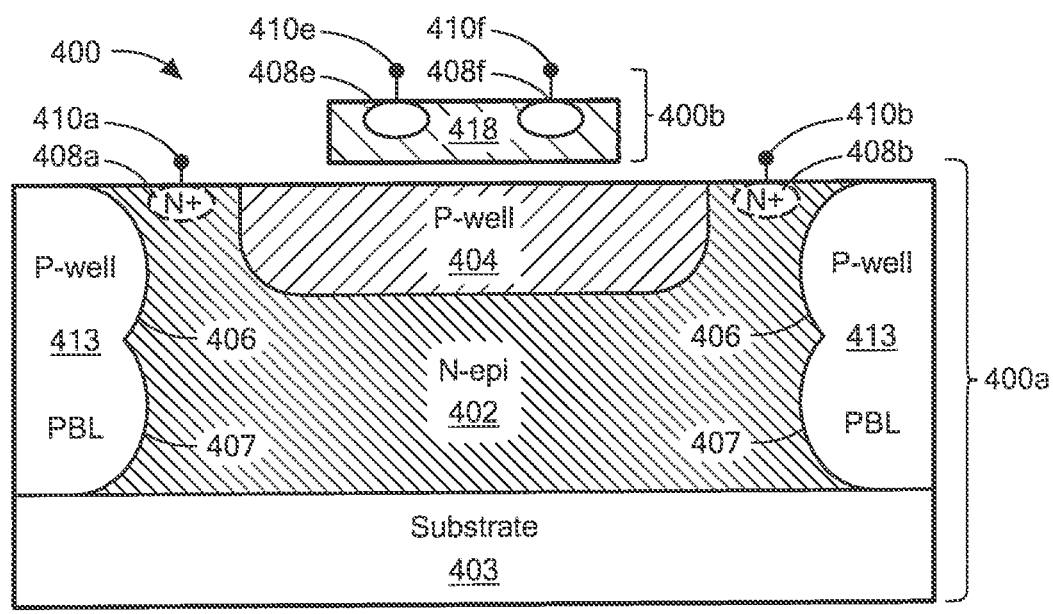
FIG. 4A is a side-view of the dual Hall effect element of FIG. 4.

Referring to FIGS. 4 and 4A together, for which FIG. 4 shows a top view of FIG. 4A, and in which like elements are shown having like reference designations, an illustrative dual Hall effect element 400 may be the same as or similar to the dual Hall effect element 102 of FIG. 1.

The dual Hall effect element 400 includes magnetic field sensing structures 400a and 400b provided over a common substrate 403. In various embodiments, the structures 400a, 400b are provided in stacked relation and, thus, the structure 400a is referred to herein as the "bottom structure" 400a, whereas the other structure 400b is referred to as the "top structure" 400b.

The bottom structure 400a may be fabricated similar to dual Hall effect element 200, as described above in conjunction with FIGS. 2 and 2A. In particular, the bottom structure 400a comprises an N-type epi region 402 disposed over a substrate 403, an outer P-well region 406 implanted and diffused into the epi region 402 to form an outer horizontal boundary thereof, and a PBL structure 407 diffused within the epi region 402 and over the substrate 403, wherein the PBL structure 407 joins/merges with the P-well region 406 forming a barrier structure (or "isolation region") 413. The bottom structure 400a also includes a first set of pickups 408 (with four pickups 408a-408d shown in this example) implanted and diffused into the epi region 402. In some embodiments, pickups 408a-408d from the first set comprise N+ type diffusions. The bottom structure 400a further includes a first set of contacts 410a-410d, each of which is associated with one of the pickups 408a-408d.

In certain embodiments, the bottom structure 400a includes an inner P-well region 404 diffused into the epi region 402, as shown. Opposing pairs of pickups from the first set of pickups (e.g., pickups 408a and 408c, and pickups 408b and 408d) may be separated by the inner P-well region 404. As discussed above, such an arrangement can increase the sensitivity of a planar Hall effect element.

The top structure 400b includes a top layer 418 and a second set of pickups 408e-408h implanted and diffused therein. In some embodiments, pickups 408e-408h from the second set comprise an N+ type diffusion. In other embodiments, pickups 408e-408h from the second set comprise a P+ type diffusion. The top structure 400b further includes a second set of contacts 410e-410h, each of which is associated with one of the pickups 408e-408h.

The top layer 418 may be comprised of any deposited material suitable for detecting a magnetic field, such as such as a poly silicon (or "poly gate") material. During fabrication, the layer 418 may be spun onto the top surface of the bottom structure 400a.

The top structure 400b is electrically isolated from the bottom structure 400a via a separation region 400c (e.g., a separation layer). In some embodiments, the separation region 400c is provided as an oxide layer.

It will be appreciated that the illustrative dual Hall effect element 400 is a dual planar (i.e., horizontal) Hall effect element.

The illustrative bottom structure 400a includes a major planar surface (shown in FIG. 4) having an outer perimeter 414 with a generally square shape. The perimeter 414 may be defined by edges of the epi region 402 bounded by the isolation region 413. In addition, the bottom structure 400a includes an inner perimeter 416 also having a generally square shape and being defined by a boundary between the inner P-well region 404 and the epi region 402. In some embodiments, the first set of four pickups 408a-408d and corresponding contacts are provided at respective corners of the outer perimeter 414, as shown.

The illustrative top structure 400b includes a major planar surface (shown in FIG. 4) having an outer perimeter 420 with a generally square shape. The perimeter 420 may be defined by edges of the top layer 418. In some embodiments, the second set of four pickups 408e-408h and corresponding contacts are provided at respective corners of the outer perimeter 420, as shown.

The first set of pickups 408a-408d disposed within the epi region 402 may correspond to the primary Hall effect element 102a (FIG. 1), whereas the second set of pickups 408e-408h disposed within the top layer 418 may correspond to the secondary Hall effect element 102b. The primary and secondary Hall elements 102a, 102b are overlaid with each other such that the secondary Hall effect element lies within or over a perimeter of the primary Hall effect element, the perimeter defined by an outer boundary of an electrical isolation structure surrounding the primary Hall effect element. Because the first and top structures 400a and 400b utilize different materials, the respective magnetic field sensitivities may differ (i.e., $field\_sensitivity_1 \neq field\_sensitivity_2$).

As with the illustrative dual Hall effect elements 200 and 300 of FIGS. 2 and 3, respectively, the primary and secondary Hall effect elements corresponding to the dual Hall effect element 400 are arranged so that axes of maximum magnetic field sensitivity are substantially parallel and centers of the perimeters (i.e., centers between the two sets of pickups 408a-408d and 408e-408h) are substantially collocated. However, it will be understood that, in contrast to the dual Hall effect elements 200 and 300, the primary and secondary Hall effect elements defined by the dual Hall effect element 400 do not share a common isolation region.

Thus, by simultaneously obtaining differential Hall outputs from a first pair of contacts disposed within epi region 402 and a second pair of contacts disposed within top layer 418, the stress state of the silicon may be deduced and appropriate corrections made to the magnetic field sensor 100 of FIG. 1.

As discussed above in conjunction with FIG. 2, a dual Hall effect element can be chopped. Referring to the dual Hall effect element 400 of FIG. 4, the primary Hall effect element 102a may alternately driven via opposing pairs of contacts 410a and 410c, and contacts 410b and 410d. Likewise, the secondary Hall effect element 102b may alternately driven via opposing pairs of contacts 410e and 410g, and contacts 410f and 410h.

Figure 5:
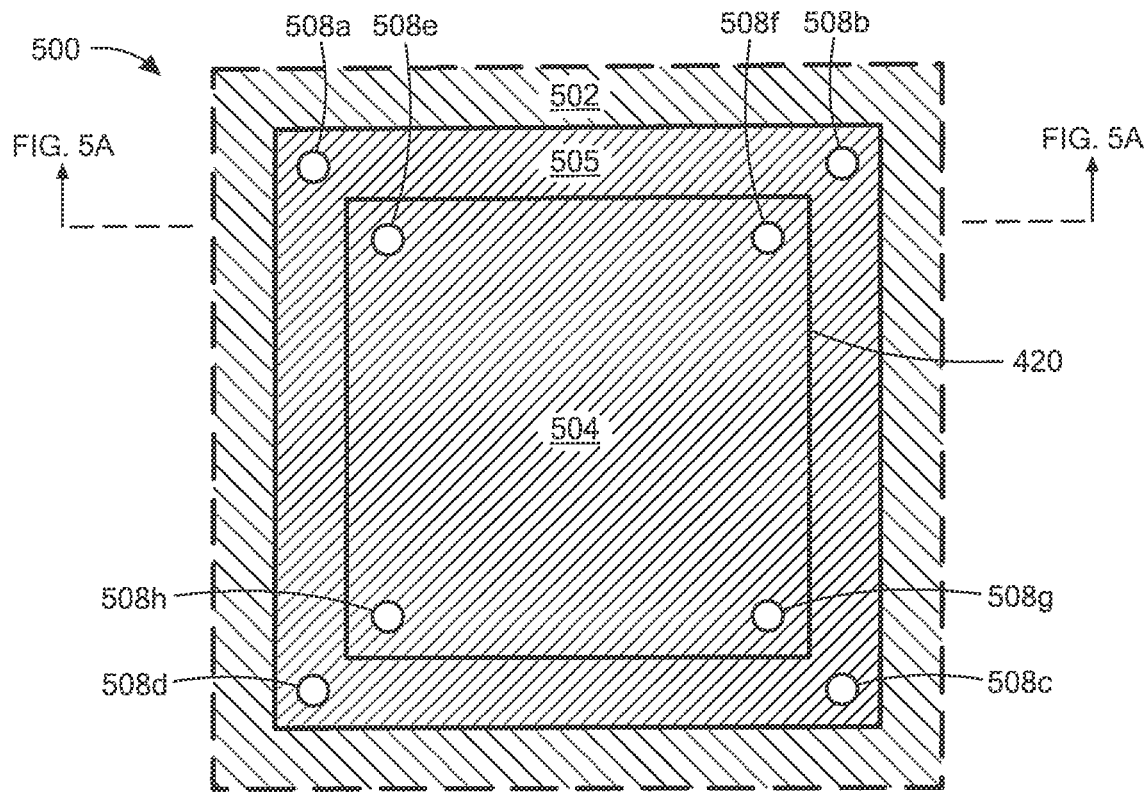
FIG. 5 is a top-view of another illustrative dual Hall effect element comprising an N-type inversion layer diffused into a P-type epitaxial region.
Figure 5A:
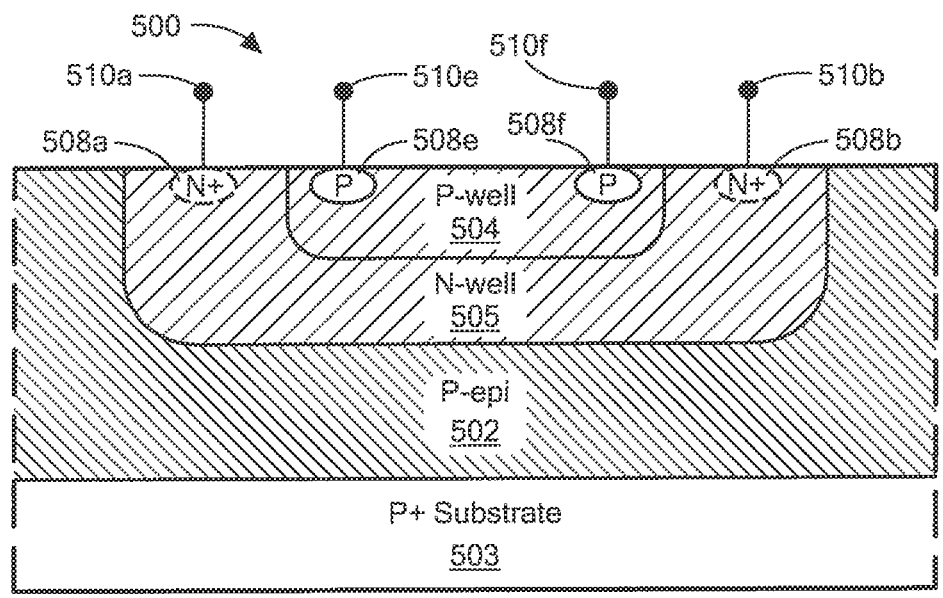
FIG. 5A is a side-view of the dual Hall effect element of FIG. 5.

Referring to FIGS. 5 and 5A together, for which FIG. 5 shows a top view of FIG. 5A, and in which like elements are shown having like reference designations, an illustrative dual Hall effect element 500 may be the same as or similar to the dual Hall effect element 102 of FIG. 1.

The dual Hall effect element 500 can be constructed over a substrate 503, within and upon an epitaxial ("epi") region (or "layer") 502 disposed upon the substrate 503. In the embodiments shown, the substrate 503 is a P+ substrate and the epi region 502 is a P-epi region. An N-well region 505 may be diffused into the P-type epi region 502, as shown. In some embodiments, the dual Hall effect element 500 includes an inner P-well region 504 diffused into the N-well region 505, as shown.

The dual Hall effect element 500 includes a first set of pickups 508a-508d implanted and diffused within the N-well region 505 and, in some embodiments, a second set of pickups 508e-508h implanted and diffused within the inner P-well region 504. In this example, opposing pairs of pickups from the first set (i.e., pickups 508a and 508c, and pickups 508b and 508d) are separated by the inner P-well region 504 and opposing pairs of pickups from the second set (i.e., pickups 508e and 508g, and pickups 508f and 508h) are diffused within the inner P-well region 504. The dual Hall effect element 500 further includes a plurality of contacts 510a-510h, each of which is associated with one of the pickups 508a-508h. In the side-view of FIG. 5A, only pickups 508a, 508e, 508f, and 508b and respective contacts 510a, 510e, 510f, and 510b are visible.

It will be appreciated that the dual Hall effect element 500 of FIG. 5 is similar to the dual Hall effect element 300 of FIG. 3. However, whereas the Hall element 300 includes a N-type epi region into which pickups are diffused, the Hall element 500 includes a P-type epi region and an N-well region diffused into the epi region and into which pickups are diffused. The N-well region 505 acts to "invert" the base material type into which the pickups are diffused (i.e., from P-type to N-type) and is thus sometimes referred to as an "N-type inversion layer." In addition, the N-well serves creates an isolation region and thus a barrier structure (e.g., structure 313 in FIG. 3) is not required, as indicated by dashed lines in FIGS. 5 and 5A.

All references cited herein are hereby incorporated herein by reference in their entirety.

Having described certain embodiments, which serve to illustrate various concepts, structures and techniques sought to be protected herein, it will be apparent to those of ordinary skill in the art that other embodiments incorporating these concepts, structures, and techniques may be used. Accordingly, it is submitted that that scope of the patent should not be limited to the described embodiments but rather should be limited only by the spirit and scope of the following claims.

The invention claimed is:

1. A dual Hall element comprising:
a substrate having a bottom surface and a top surface;
an N-type epitaxial layer disposed over the substrate top surface, the epitaxial layer having a top surface and a bottom surface;
a barrier structure disposed over the substrate and extending perpendicular from the epitaxial layer top surface so as to form a barrier to electrical charges within the epitaxial layer and resulting in a bounded region of the epitaxial layer having a generally octagonal shape;
a P-well region diffused into the epitaxial layer; and
a plurality of pickups implanted and diffused into the epitaxial layer, opposing pairs of the plurality of pickups separated by the P-well region, each one of the plurality of pickups comprising an N+ type diffusion,
wherein a first set of the plurality of pickups is operable to form a first planar Hall element and a second different set of the plurality of pickups is operable to form a second planar Hall element.

2. The dual Hall element of claim 1, wherein the first planar Hall element has a first central axis perpendicular to the top surface of the substrate, wherein the second planar Hall element has a second central axis perpendicular to the top surface of the substrate, wherein the first and second central axes are substantially collocated.

3. A dual Hall element comprising:
a substrate having a bottom surface and a top surface;
an N-type epitaxial layer disposed over the substrate top surface, the epitaxial layer having a top surface and a bottom surface;
a barrier structure disposed over the substrate and extending perpendicular from the epitaxial layer top surface so as to form a barrier to electrical charges within the epitaxial layer;
a P-well region diffused into the epitaxial layer;
a first plurality of pickups implanted and diffused into the epitaxial layer, opposing pairs of the first plurality of pickups separated by the P-well region, each one of the first plurality of pickups comprising an N+ type diffusion; and
a second plurality of pickups implanted and diffused into the P-well region, each one of the second plurality of pickups comprising a P+ type diffusion,
wherein the first plurality of pickups is operable to form a first planar Hall element and the second plurality of pickups is operable to form a second planar Hall element.

4. The dual Hall element of claim 3, wherein the first planar Hall element has a first central axis perpendicular to the top surface of the substrate, wherein the second planar Hall element has a second central axis perpendicular to the top surface of the substrate, wherein the first and second central axes are substantially collocated.

5. A dual Hall element comprising:
a bottom structure including:
a substrate having a bottom surface and a top surface;
an N-type epitaxial layer disposed over the substrate top surface, the epitaxial layer having a top surface and a bottom surface;
a barrier structure disposed over the substrate and extending perpendicular from the epitaxial layer top surface so as to form a barrier to electrical charges within the epitaxial layer;
a P-well region diffused into the epitaxial layer; and
a first plurality of pickups implanted and diffused into the epitaxial layer, opposing pairs of the first plurality of pickups separated by the P-well region, each one of the first plurality of pickups comprising an N+ type diffusion; and
a top structure electrically isolated from the bottom structure via an isolation region, the top structure including:
a top layer; and
a second plurality of pickups implanted and diffused into the top layer,
wherein the first plurality of pickups is operable to form a first planar Hall element and the second plurality of pickups is operable to form a second planar Hall element.

6. The dual Hall element of claim 5 wherein the top layer comprises a poly silicon material.

7. The dual Hall element of claim 5 wherein each one of the second plurality of pickups comprises a P+ type diffusion.

8. The dual Hall element of claim 5 wherein each one of the second plurality of pickups comprises a N+ type diffusion.

9. The dual Hall element of claim 5, wherein the first planar Hall element has a first central axis perpendicular to the top surface of the substrate, wherein the second planar Hall element has a second central axis perpendicular to the top surface of the substrate, wherein the first and second central axes are substantially collocated.

10. A dual Hall element comprising:
a substrate having a bottom surface and a top surface;

an P-type epitaxial layer disposed over the substrate top surface, the epitaxial layer having a top surface and a bottom surface;
an N-well region diffused into the epitaxial layer;
a P-well region diffused into the N-well region;
a first plurality of pickups implanted and diffused into the N-well region, opposing pairs of the first plurality of pickups separated by the P-well region, each one of the first plurality of pickups comprising an N+ type diffusion; and
a second plurality of pickups implanted and diffused into the P-well region, each one of the second plurality of pickups comprising a P+ type diffusion,
wherein the first plurality of pickups is operable to form a first Hall element and the second plurality of pickups is operable to form a second Hall element.

11. The dual Hall element of claim 10, wherein the first Hall element comprises a first planar Hall element, and wherein the second planar Hall element comprises a second planar Hall element.

12. The dual Hall element of claim 10, wherein the first planar Hall element has a first central axis perpendicular to the top surface of the substrate, wherein the second planar Hall element has a second central axis perpendicular to the top surface of the substrate, wherein the first and second central axes are substantially collocated.

13. A magnetic field sensor comprising a dual Hall element, the dual Hall element comprising:
a substrate having a bottom surface and a top surface;
an N-type epitaxial layer disposed over the substrate top surface;
a first planar Hall element disposed within or over the epitaxial layer, the first planar Hall element having a first plurality of pickups with a first center between the first plurality of pickups; and
a second planar Hall element disposed within or over the epitaxial layer, the second planar Hall element having a second different plurality of pickups with a second center between the second plurality of pickups, wherein the first and second centers are substantially collocated.

14. The magnetic field sensor of claim 13, wherein the first planar Hall element has a first sensitivity to a magnetic field and a first sensitivity to mechanical stress in the substrate, the first planar Hall element for generating a first output signal responsive to the magnetic field, the first magnetic field sensitivity, mechanical stress in the substrate, and the first mechanical stress sensitivity, and wherein the second planar Hall element has a second sensitivity to the magnetic field and a second sensitivity to mechanical stress in the substrate, the second planar Hall element for generating a second output signal responsive to the magnetic field, the second magnetic field sensitivity, the mechanical stress in the substrate, and the second mechanical stress sensitivity.

15. The magnetic field sensor of claim 14, further comprising:
a stress compensation module coupled to receive a first stress compensation input signal responsive to the first output signal and a second stress compensation input signal responsive to the second output signal and to generate a stress compensation signal; and
an adjustable gain stage coupled to amplify the first output signal with a gain in accordance with the stress compensation signal to generate a stress-compensated output signal, wherein the stress-compensated output signal is responsive to the magnetic field, and is not responsive to the mechanical stress in the substrate.

16. The magnetic field sensor of claim 15, wherein the stress compensation module is configured to calculate the gain using the first magnetic field sensitivity, the second magnetic field sensitivity, the first output signal, and the second output signal, wherein the stress compensation signal is based upon the gain.

17. The magnetic field sensor of claim 15, wherein the stress compensation module is configured to calculate the gain using the first magnetic field sensitivity and the second magnetic field sensitivity, wherein the stress compensation signal is based upon the gain.

18. The magnetic field sensor of claim 15, further comprising a first amplifier coupled to receive the first output signal and to generate the first stress compensation input signal and a second amplifier coupled to receive the second output signal and to generate the second stress compensation input signal.

19. The magnetic field sensor of claim 18, wherein the first and second output signals are responsive to a substrate temperature, wherein the first and second stress compensation signals are not responsive to the substrate temperature.

20. The magnetic field sensor of claim 18, further comprising a threshold detector coupled to receive a threshold level signal and a threshold detector input signal responsive to the first output signal, the threshold detector configured to generate an enabling signal based upon the threshold level signal and the threshold detector input signal.

21. The magnetic field sensor of claim 20, wherein the stress compensation module is coupled to receive the enabling signal and configured to calculate the gain in response to the enabling signal.

22. The magnetic field sensor of claim 13, wherein the first planar Hall element has a first central axis perpendicular to the top surface of the substrate, wherein the second planar Hall element has a second central axis perpendicular to the top surface of the substrate, wherein the first and second central axes are substantially collocated.

* * * * *

UNITED STATES PATENT AND TRADEMARK OFFICE
CERTIFICATE OF CORRECTION

PATENT NO. : 10,746,817 B2
APPLICATION NO. : 15/807741
DATED : August 18, 2020
INVENTOR(S) : Steven Kosier et al.

It is certified that error appears in the above-identified patent and that said Letters Patent is hereby corrected as shown below:

In the Specification

Column 4, Line 14 delete "FIG. 1 is block" and replace with --FIG. 1 is a block--.

Column 5, Line 27 delete "and secondary" and replace with --and a secondary--.

Column 7, Line 67 delete "to gain" and replace with --the gain--.

Column 8, Line 34 delete "correspond signal" and replace with --correspond to signal--.

Column 8, Line 37 delete "correspond signal" and replace with --correspond to signal--.

Column 8, Line 65 delete "larger then" and replace with --larger than--.

Column 10, Line 27 delete ". If the case" and replace with --. In the case--.

Column 11, Line 23 delete "and N+" and replace with --an N+--.

Column 11, Line 33 delete ", 201$g$" and replace with --, 210$g$--.

Column 13, Line 8 delete "20$e$8" and replace with --208$e$--.

Column 13, Line 52 delete "alternate driven" and replace with --alternately be driven--.

Column 14, Line 50 delete "P-well 304" and replace with --P-well region 304--.

Column 14, Lines 63-64 delete "N-type epi 302" and replace with --N-type epi region 302--.

Column 14, Lines 64-65 delete "P-well 304," and replace with --P-well region 304,--.

Signed and Sealed this
Fifteenth Day of June, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,746,817 B2

Column 15, Line 6 delete "alternately driven" and replace with --alternately be driven--.

Column 15, Lines 53-54 delete ", such as such as" and replace with --, such as--.

Column 16, Line 49 delete "alternately driven" and replace with --alternately be driven--.

Column 16, Line 52 delete "alternately driven" and replace with --alternately be driven--.

Column 17, Lines 25-26 delete "serves creates" and replace with --and creates--.

Column 17, Line 36 delete "that that" and replace with --that the--.